US012148822B2

(12) United States Patent
Li

(10) Patent No.: US 12,148,822 B2
(45) Date of Patent: Nov. 19, 2024

(54) INTEGRATED CIRCUIT STRUCTURE OF GROUP III NITRIDE SEMICONDUCTOR, MANUFACTURING METHOD THEREOF, AND USE THEREOF

(71) Applicant: GUANGDONG ZHINENG TECHNOLOGY CO., LTD., Guangdong (CN)

(72) Inventor: Zilan Li, Guangzhou (CN)

(73) Assignee: GUANGDONG ZHINENG TECHNOLOGY CO., LTD., Guangdong (CN)

( * ) Notice: Subject to any disclaimer, the term of this patent is extended or adjusted under 35 U.S.C. 154(b) by 47 days.

(21) Appl. No.: 17/436,011

(22) PCT Filed: Mar. 3, 2021

(86) PCT No.: PCT/CN2021/078955
§ 371 (c)(1),
(2) Date: Sep. 2, 2021

(87) PCT Pub. No.: WO2021/218371
PCT Pub. Date: Nov. 4, 2021

(65) Prior Publication Data
US 2023/0044911 A1 Feb. 9, 2023

(30) Foreign Application Priority Data
Apr. 29, 2020 (CN) .......................... 202010361160.4

(51) Int. Cl.
H01L 29/778 (2006.01)
H01L 21/8252 (2006.01)
(Continued)

(52) U.S. Cl.
CPC ...... H01L 29/7786 (2013.01); H01L 21/8252 (2013.01); H01L 27/098 (2013.01); H01L 29/66462 (2013.01)

(58) Field of Classification Search
CPC ............ H01L 29/7786; H01L 21/8252; H01L 27/098; H01L 29/66462; H01L 29/045;
(Continued)

(56) References Cited

U.S. PATENT DOCUMENTS

2014/0264380 A1* 9/2014 Kub .................... H01L 29/7787
257/77
2016/0372575 A1* 12/2016 Renaud ............... H01L 21/8252

FOREIGN PATENT DOCUMENTS

| CN | 111816700 A | 10/2020 |
| CN | 111816706 A | 10/2020 |
| CN | 107078098 A | 4/2021 |

OTHER PUBLICATIONS

Kuphaldt ("Lessons In Electric Circuits, vol. IV—Digital," 4th edition, Nov., 2007), (hereinafter, Kuphaldt) (Year: 2007).*
(Continued)

Primary Examiner — Yasser A Abdelaziez
(74) Attorney, Agent, or Firm — Casimir Jones, S.C.; Robert A. Goetz

(57) ABSTRACT

The present disclosure provides an integrated circuit structure of a group III nitride semiconductor, a manufacturing method thereof, and use thereof. The integrated circuit structure is a complementary circuit of HEMT and HHMT based on the group III nitride semiconductor, and can realize the integration of HEMT and HHMT on the same substrate, and the HEMT and the HHMT respectively have a polarized junction with a vertical interface, the crystal orientations of the polarized junctions of the HEMT and the HHMT are different, the two-dimensional carrier gas forms a carrier
(Continued)

channel in a direction parallel to the polarized junction, and corresponding channel carriers are almost depleted by burying the doped region.

10 Claims, 14 Drawing Sheets

(51) Int. Cl.
*H01L 27/098* (2006.01)
*H01L 29/66* (2006.01)

(58) Field of Classification Search
CPC ............. H01L 29/2003; H01L 29/7789; H01L 27/0605; H01L 27/085; H01L 29/778; H01L 27/088
See application file for complete search history.

(56) References Cited

OTHER PUBLICATIONS

International Search Report and Written Opinion for PCT/CN2021/078955 issued May 21, 2021, 11 total pages.

* cited by examiner

INTEGRATED CIRCUIT STRUCTURE OF GROUP III NITRIDE SEMICONDUCTOR, MANUFACTURING METHOD THEREOF, AND USE THEREOF

CROSS-REFERENCE TO RELATED APPLICATION

This application is a 35 U.S.C § 371 national stage application of International Patent Application No. PCT/CN2021/078955 filed on Mar. 3, 2021 and entitled "INTEGRATED CIRCUIT STRUCTURE OF GROUP III NITRIDE SEMICONDUCTOR, MANUFACTURING METHOD THEREOF, AND USE THEREOF," which application claims the benefit of priority to Chinese Patent Application No. 202010361160.4 filed Apr. 29, 2020, the disclosures and contents of all of which are hereby incorporated by reference in their entireties.

TECHNICAL FIELD

The present disclosure relates to the field of semiconductor integrated circuits, more particularly, to an integrated circuit structure of a group III nitride semiconductor, a manufacturing method thereof, and use thereof.

BACKGROUND ART

Wide-forbidden-band semiconductors such as group III nitride semiconductors have become the focus of research in the semiconductor industry due to their excellent performances such as high critical breakdown electric field, large electron saturation rate, high thermal conductivity, and strong radiation resistance. In recent years, group III nitride semiconductors and devices have been gaining popularity in the fields of radio frequency/microwave, mobile communications, and semiconductor illumination, power integrated circuit design, and the like. Although group III nitride semiconductor discrete devices exhibit unprecedented switching speeds and operating frequencies, in practical circuit application, inter-chip parasitic inductance will severely limit the switching speed of group III nitride semiconductor discrete devices. One effective way to reduce the parasitic inductance is to research and develop integrated circuits utilizing the group III nitride semiconductors.

The key to realizing an integrated circuit of group III nitride semiconductor is to break through the complementary circuit technology using the group III nitride semiconductor. Taking the conventional silicon-based integrated circuit as an example, a basic structure of logic circuit thereof is constituted by a complementary metal oxide semiconductor (CMOS). The CMOS is a complementary integrated circuit jointly composed of a P-channel MOS device and an N-channel MOS device. For group III nitride semiconductor materials, N-channel transistors (High Electron Mobility Transistor, HEMT) based on two-dimensional electron gas (2DEG) have been developed well, while P-type AlGaN/GaN structure has been studied little and has many challenges, such as how to overcome P-type doping difficulty of source region and drain region, and realize monolithic integration of P-channel devices and N-channel devices. Therefore, the difficulty of the current complementary high mobility transistor (CHMT) technology lies in researching a P-channel transistor (High Hole Mobility Transistor, HHMT), i.e., fabricating a P-channel transistor by taking a two-dimensional hole gas (2DHG) at an interface of heterogeneous material as a P-channel layer, so as to realize monolithic integration with an N-channel transistor.

In addition, there are still other technical difficulties that need to be overcome. Since a group III nitride semiconductor heterojunction has a strong polarization effect, high concentration of two-dimensional carrier gas exists at a heterojunction interface, and a high mobility transistor fabricated with such a two-dimensional carrier gas is generally of a normally-on type. However, in practical circuit application, normally-off transistors are usually required for power saving and convenient control. Therefore, the realization of an enhanced high mobility transistor with high performances such as high withstand voltage, high power, and low on-resistance has been one of the important issues in the industry.

SUMMARY

In view of the above situation, the present disclosure provides an integrated circuit structure of a complementary group III nitride semiconductor, and a manufacturing method thereof.

In the following, a brief summary of the present disclosure will be given in order to provide a basic understanding of certain aspects of the present disclosure. It should be understood that this summary is not an exhaustive summary of the present disclosure. It is not intended to determine the key or important part of the present disclosure, nor is it intended to limit the scope of the present disclosure. Its purpose is merely to present some concepts in a simplified form as a prelude to the more detailed description that will be discussed later.

According to one aspect of the present disclosure, the present disclosure provides an integrated circuit structure, including:
  at least one first transistor, including:
    a first nitride semiconductor structure having a first polarized junction, which has a two-dimensional carrier gas of a first conductivity type;
    a first gate electrode, which is provided on the first nitride semiconductor structure; and
    a first source electrode and a first drain electrode, which are distributed opposite to each other on either side of the first gate electrode, and are coupled with the two-dimensional carrier gas of the first conductivity type; and
  at least one second transistor, including:
    a second nitride semiconductor structure having a second polarized junction, which has a two-dimensional carrier gas of a second conductivity type;
    a second gate electrode, which is provided on the second nitride semiconductor structure; and
    a second source electrode and a second drain electrode, which are distributed opposite to each other on either side of the second gate electrode, and are electrically coupled with the two-dimensional carrier gas of the second conductivity type, wherein
  the first polarized junction and the second polarized junction have different crystal orientations,
  the two-dimensional carrier gas of the first conductivity type and the two-dimensional carrier gas of the second conductivity type are of different conductivity types, and
  the two-dimensional carrier gas of the first conductivity type and the two-dimensional carrier gas of the second conductivity type form a carrier channel in a direction parallel to the first polarized junction and in a direction parallel to the second polarized junction, respectively.

Optionally, the first nitride semiconductor structure and the second nitride semiconductor structure are epitaxially grown on a same substrate.

Optionally, the first polarized junction and the second polarized junction each have a vertical interface.

Optionally, a crystal orientation of the first polarized junction of the first nitride semiconductor structure is <0001>, and a surface thereof is (0001) face.

Optionally, a crystal orientation of the second polarized junction of the second nitride semiconductor structure is <000$\bar{1}$>, and a surface thereof is (000$\bar{1}$) face.

Optionally, the substrate is silicon, sapphire, silicon carbide or gallium nitride.

Optionally, the two-dimensional carrier gas of the first conductivity type is two-dimensional electron gas.

Optionally, the two-dimensional carrier gas of the second conductivity type is two-dimensional hole gas.

Optionally, the first nitride semiconductor structure further includes a first doped structure, and the first doped structure is electrically coupled with the two-dimensional carrier gas of the first conductivity type.

Optionally, the second nitride semiconductor structure further includes a second doped structure, and the second doped structure is electrically coupled with the two-dimensional carrier gas of the second conductivity type.

Optionally, the first doped structure includes at least one doped region of the second conductivity type, which at least partially overlaps the first gate electrode in a projection direction of crystal orientation.

Optionally, the first doped structure further includes a plurality of doped regions of the first conductivity type, which are electrically coupled with the first source electrode and the first drain electrode.

Optionally, the second doped structure includes at least one doped region of the first conductivity type, which at least partially overlaps the second gate electrode in the projection direction of crystal orientation.

Optionally, the second doped structure further includes a plurality of doped regions of the second conductivity type, which are electrically coupled with the second source electrode and the second drain electrode.

Optionally, the first transistor realizes a normally-off type through the doped region of the second conductivity type at least partially overlapping the first gate electrode in the projection direction of crystal orientation.

Optionally, the second transistor realizes the normally-off type through the doped region of the first conductivity type at least partially overlapping the second gate electrode in the projection direction of crystal orientation.

Optionally, the first nitride semiconductor structure further includes a laminated structure of the first region of the first nitride semiconductor layer and the second nitride semiconductor layer, wherein the first nitride semiconductor layer and the second nitride semiconductor layer have different forbidden band widths, and the carrier channel is formed on an interface between the first region of the first nitride semiconductor layer and the second nitride semiconductor layer.

Optionally, the second nitride semiconductor structure further includes a laminated structure of the second region of the first nitride semiconductor layer and the second nitride semiconductor layer, wherein the first nitride semiconductor layer and the second nitride semiconductor layer have different forbidden band widths, and the carrier channel is formed on an interface between the second region of the first nitride semiconductor layer and the second nitride semiconductor layer.

Optionally, the first transistor and the second transistor are complementary and connected in series, wherein the first gate electrode and the second gate electrode are connected together as an input terminal, either the first source electrode or the second source electrode is coupled with ground or an external negative power supply $V_{SS}$, either the second source electrode or the first source electrode is coupled with an external positive power supply $V_{DD}$, and the first drain electrode and the second drain electrode are connected together as an output terminal.

Optionally, at least two first transistors are connected in series or in parallel as a first unit, at least two second transistors are connected in parallel or in series as a second unit, wherein the series connection or parallel connection in the first unit is corresponding to the parallel connection or series connection in the second unit, and the first unit and the second unit are connected in series as an output terminal, the first transistor in the first unit is in complementary pairing with the second transistor in the second unit, and the first gate electrode and the second gate electrode of transistors in complementary pairing are connected together to serve as input terminals, respectively.

Optionally, when at least two first transistors in the first unit are connected in series, any one of the first source electrodes is coupled with ground or the external negative power supply $V_{SS}$, any one of the first drain electrodes serves as an output terminal to be coupled with the second unit, and the remaining first source electrodes and first drain electrodes are connected in series in sequence.

Optionally, when at least two second transistors in the second unit are connected in parallel, the first source electrodes are connected together to be coupled with an external positive power supply $V_{DD}$, and the first drain electrodes are connected together as an output terminal to be coupled with the first unit.

Optionally, when at least two first transistors in the first unit are connected in parallel, the first source electrodes are connected together to be coupled with ground or an external negative power supply $V_{SS}$, and the first drain electrodes are connected together as an output terminal to be coupled with the second unit.

Optionally, when at least two second transistors in the second unit are connected in series, any one of the first source electrodes is coupled with the external positive power supply $V_{DD}$, any one of the first drain electrodes serves at an output terminal to be coupled with the first unit, and the remaining first source electrodes and remaining first drain electrodes are connected in series in sequence.

Optionally, the first transistors in the first unit may be connected in series or in parallel in any number, and a corresponding number of second transistors in the second unit in complementary pairing with the first transistors in the first unit may be connected in parallel or in series.

Optionally, the integrated circuit structure further includes a nucleation layer.

Optionally, the source electrodes/drain electrodes in the series connection or parallel connection may be coupled with ground or an external negative power supply $V_{SS}$.

Optionally, the source electrodes/drain electrodes in the series connection or parallel connection may be coupled with an external positive power supply $V_{DD}$.

Optionally, a first body electrode is further included, which is electrically connected to the doped region of the second conductivity type.

Optionally, a second body electrode is further included, which is electrically connected to the doped region of the first conductivity type.

According to another aspect of the present disclosure, an electronic device is provided.

According to another aspect of the present disclosure, the present disclosure provides a method for manufacturing an integrated circuit structure, including steps of:
forming at least one first transistor, which includes:
forming a first nitride semiconductor structure having a first polarized junction, which has a two-dimensional carrier gas of a first conductivity type;
forming at least one second transistor, which includes:
forming a second nitride semiconductor structure having a second polarized junction, which has a two-dimensional carrier gas of a second conductivity type, wherein
the first nitride semiconductor structure and the second nitride semiconductor structure are formed simultaneously,
the first polarized junction and the second polarized junction have different crystal orientations, and the polarized junctions each have a vertical interface,
the two-dimensional carrier gas of the first conductivity type and the two-dimensional carrier gas of the second conductivity type are of different conductivity types, and
the two-dimensional carrier gas of the first conductivity type and the two-dimensional carrier gas of the second conductivity type form a carrier channel in a direction parallel to the first polarized junction and in a direction parallel to the second polarized junction, respectively Optionally, the step of forming at least one first transistor further includes:
forming a first gate electrode, which is provided on the first nitride semiconductor structure; and
forming a first source electrode and a first drain electrode, respectively, which are distributed opposite to each other on either side of the first gate electrode, and are coupled with the two-dimensional carrier gas of the first conductivity type.

Optionally, the step of forming at least one second transistor further includes:
forming a second gate electrode, which is provided on the second nitride semiconductor structure; and
forming a second source electrode and a second drain electrode, respectively, which are distributed opposite to each other on either side of the second gate electrode, and are electrically coupled with the two-dimensional carrier gas of the second conductivity type.

Optionally, a substrate is provided, and the first nitride semiconductor structure and the second nitride semiconductor structure are formed on the substrate.

Optionally, the first nitride semiconductor structure and the second nitride semiconductor structure each include a laminated structure of different regions of the first nitride semiconductor layer and the second nitride semiconductor layer.

Optionally, the step of forming the first nitride semiconductor structure and the second nitride semiconductor structure on the substrate further includes:
forming a plurality of first grooves on the substrate, and epitaxially growing laterally the first nitride semiconductor layer on a side wall of the first groove to fill the first groove;
removing a part of the substrate between the first nitride semiconductor layers to form a plurality of second grooves; and
epitaxially growing a second nitride semiconductor layer respectively on side surfaces of different regions of the first nitride semiconductor layer in the second groove.

Optionally, the step of forming the transistor further includes:
forming one or more first gate electrodes, first source electrodes and first drain electrodes, and one or more second gate electrodes, second source electrodes and second drain electrodes respectively on the first nitride semiconductor layer and the second nitride semiconductor structure in the second groove.

Optionally, the first polarized junction of the first nitride semiconductor structure is formed on a crystal orientation of <0001> direction, which has a (0001) crystal face.

Optionally, the second polarized junction of the second nitride semiconductor structure is formed on a crystal orientation of <000$\bar{1}$> direction, which has a (000$\bar{1}$) crystal face.

Optionally, the substrate is silicon, sapphire, silicon carbide or gallium nitride.

Optionally, the two-dimensional carrier gas of the first conductivity type is two-dimensional electron gas, and the two-dimensional carrier gas of the second conductivity type is two-dimensional hole gas.

Optionally, the step of forming a first nitride semiconductor structure having a polarized junction further includes:
forming a first doped structure, wherein the first doped structure is electrically coupled with the two-dimensional carrier gas of the first conductivity type.

Optionally, the step of forming a second nitride semiconductor structure having a polarized junction further includes:
forming a second doped structure, wherein the second doped structure is electrically coupled with the two-dimensional carrier gas of the second conductivity type.

Optionally, the first doped structure includes at least one doped region of the second conductivity type, which at least partially overlaps the first gate electrode in the projection direction of crystal orientation.

Optionally, the first doped structure further includes a plurality of doped regions of the first conductivity type, which are electrically coupled with the first source electrode and the first drain electrode.

Optionally, the second doped structure includes at least one doped region of the first conductivity type, which at least partially overlaps the second gate electrode in the projection direction of crystal orientation.

Optionally, the second doped structure further includes a plurality of doped regions of the second conductivity type, which are electrically coupled with the second source electrode and the second drain electrode.

Optionally, a first body electrode is further formed, which is electrically connected to the doped region of the second conductivity type.

Optionally, a second body electrode is further formed, which is electrically connected to the doped region of the first conductivity type.

Optionally, the two-dimensional carrier gas between the first transistors and/or the second transistors is further removed, and an insulating medium is filled.

Optionally, the step of forming the first nitride semiconductor structure having a polarized junction further includes:

forming a laminated structure of the first region of the first nitride semiconductor layer and the second nitride semiconductor layer, wherein the first nitride semiconductor layer and the second nitride semiconductor layer have different forbidden band widths, and the carrier channel is formed on an interface between the first region of the first nitride semiconductor layer and the second nitride semiconductor layer.

Optionally, the step of forming the second nitride semiconductor structure having a polarized junction further includes:

forming a laminated structure of the second region of the first nitride semiconductor layer and the second nitride semiconductor layer, wherein the first nitride semiconductor layer and the second nitride semiconductor layer have different forbidden band widths, and the carrier channel is formed on an interface between the second region of the first nitride semiconductor layer and the second nitride semiconductor layer.

An integrated circuit structure of a group III nitride semiconductor, including:

at least one first transistor, including:

a first nitride semiconductor structure having a first polarized junction, which has a two-dimensional carrier gas of a first conductivity type;

a first gate electrode, which is provided on the first nitride semiconductor structure; and a first source electrode and a first drain electrode, which are distributed opposite to each other on either side of the first gate electrode, and are coupled with the two-dimensional carrier gas of the first conductivity type; and at least one second transistor, including:

a second nitride semiconductor structure having a second polarized junction, which has a two-dimensional carrier gas of a second conductivity type;

a second gate electrode, which is provided on the second nitride semiconductor structure; and a second source electrode and a second drain electrode, which are distributed opposite to each other on either side of the second gate electrode, and are electrically coupled with the two-dimensional carrier gas of the second conductivity type, wherein the first polarized junction and the second polarized junction have different crystal orientations, the two-dimensional carrier gas of the first conductivity type and the two-dimensional carrier gas of the second conductivity type are of different conductivity types, and the two-dimensional carrier gas of the first conductivity type and the two-dimensional carrier gas of the second conductivity type form a carrier channel in a direction parallel to the first polarized junction and in a direction parallel to the second polarized junction, respectively.

BRIEF DESCRIPTION OF DRAWINGS

Specific contents of the present disclosure are described in the following with reference to the accompanying drawings, which will help to more easily understand the above and other objectives, features, and advantages of the present disclosure. The accompanying drawings are only to illustrate the principle of the present disclosure. In the accompanying drawings, it is not necessary to draw the size and relative positions of the units according to scale. In the accompanying drawings.

DETAILED DESCRIPTION OF EMBODIMENTS

Figure 1:
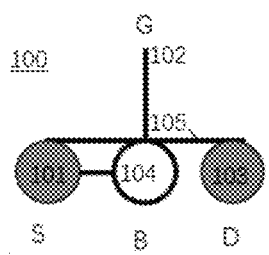
FIG. 1 is a schematic diagram of circuit symbols of a high electron mobility transistor and a high hole mobility transistor.
Figure 1:
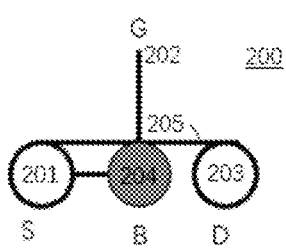

Exemplary contents disclosed in the present disclosure will be described below in conjunction with the accompanying drawings. For the sake of clarity and conciseness, not all features that realize the present disclosure are described in the description. It is also to be noted herein that, in order to avoid obscuring the present disclosure with unnecessary details, only device structures closely related to the solution according to the present disclosure are shown in the accompanying drawings, and other details not closely related to the present disclosure are omitted. In the drawings, the same reference signs refer to corresponding parts throughout different drawings. Meanwhile, in the description of the present disclosure, terms such as "first" and "second" are merely used for distinctive description, but should not be construed as indicating or implying importance in the relativity, nor implying a sequence or order.

It should be understood that the contents in the present disclosure are not merely limited to the embodiments described although the following descriptions are made with reference to the accompanying drawings. In the text, words "exemplary", "a (an)", and "optionally" and other wordings with similar meanings are meant to be used as examples, instances or illustrations. In the text, any examples or embodiments that may be described as "examples" are not necessarily construed as being preferred or advantageous over other embodiments. The features between different embodiments may be replaced or borrowed, and one or more features may be omitted in one solution, where feasible.

Figure 41:
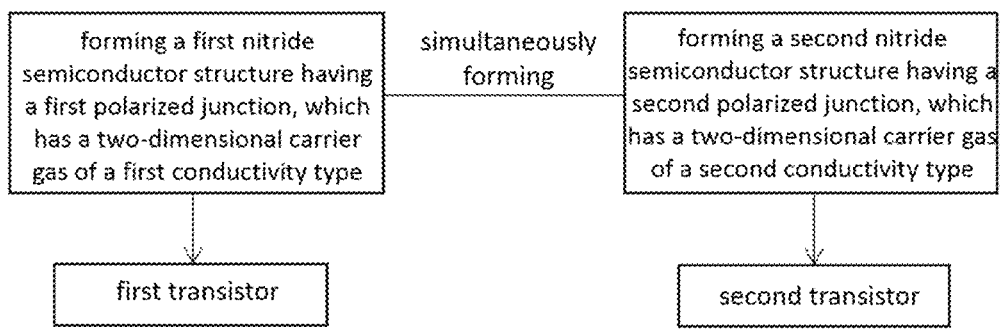
FIG. 41 is schematic block diagram of a manufacturing method of a nitride integrated circuit structure.

Specifically, as shown in FIG. 41, an integrated circuit structure in the present disclosure is a complementary integrated circuit based on a group III nitride semiconductor, including: at least one first transistor and at least one second transistor. The first transistor includes: a first nitride semiconductor structure having a first polarized junction, which has a two-dimensional carrier gas of a first conductivity type; a first gate electrode, which is provided on the first nitride semiconductor structure; and a first source electrode and a first drain electrode, which are distributed opposite to each other on two sides of the first gate electrode, and are coupled with the two-dimensional carrier gas of the first conductivity type. The second transistor includes: a second nitride semiconductor structure having a second polarized junction, which has a two-dimensional carrier gas of a second conductivity type; a second gate electrode, which is provided on the second nitride semiconductor structure; and a second source electrode and a second drain electrode, which are distributed opposite to each other on two sides of the second gate electrode, and are electrically coupled with the two-dimensional carrier gas of the second conductivity type. The first polarized junction and the second polarized junction have different crystal orientations; the two-dimensional carrier gas of the first conductivity type and the two-dimensional carrier gas of the second conductivity type are of different conductivity types; and the two-dimensional carrier gas of the first conductivity type and the two-dimensional carrier gas of the second conductivity type form carrier channels in a direction parallel to the first polarized junction and in a direction parallel to the second polarized junction, respectively.

The integrated circuit structure in the present disclosure can be widely used in electronic devices having analog and/or digital integrated circuits such as phase inverters, amplifiers, inverters, NAND gates, and NOR gates, so as to realize functions such as operation, amplification, transmission, transformation/conversion and logic.

An integrated circuit structure according to the present disclosure is described with reference to FIG. 1-FIG. 7. FIG. 1 schematically shows circuit symbols of a high electron mobility transistor (HEMT) and a high hole mobility transistor (HHMT). The HEMT 100 includes a first source electrode 101, a first drain electrode 103, a first gate electrode 102, and a first body electrode 104, wherein a two-dimensional electron gas (2DEG) channel 105 is between the first source electrode 101 and the first drain electrode 103, and solid spheres represent electrons. An HHMT 200 includes a second source electrode 201, a second drain electrode 203, a second gate electrode 202, and a second body electrode 204, wherein a two-dimensional hole gas (2DHG) channel 205 is between the second source electrode 201 and the second drain electrode 203, and solid spheres represent holes. The first gate electrode 102 and the second gate electrode 202 control on and off of conductive channels of the HEMT 100 and the HHMT 200, respectively, and the first body electrode 104 and the second body electrode 204 control threshold voltages of the HEMT 100 and the HHMT 200, respectively. In the present disclosure, the HEMT 100 may serve as a first transistor, and the HHMT 200 may serve as a second transistor, or vice versa.

Figure 2:
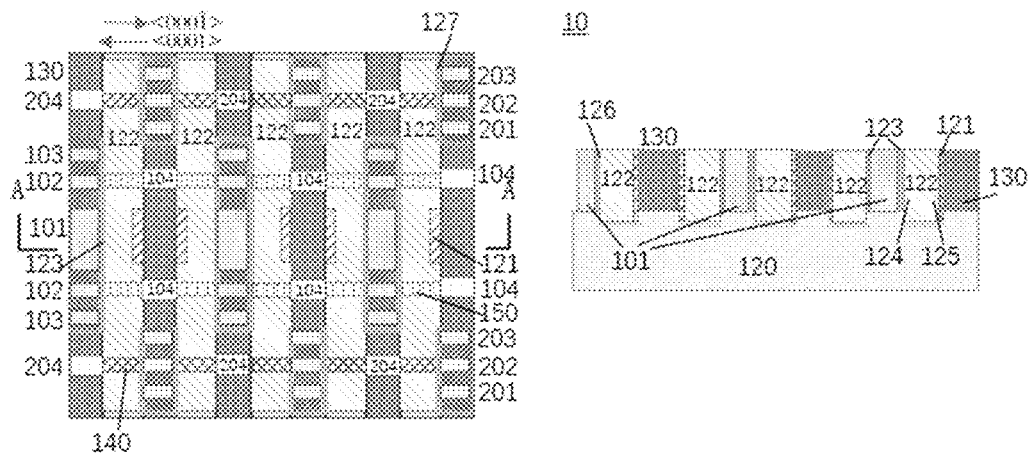
FIG. 2 is a plan view and a sectional view in A-A direction of an integrated circuit structure 10 of a group III nitride semiconductor.

FIG. 2 shows a plan view and a sectional view in A-A direction of an integrated circuit structure 10 of a group III nitride semiconductor. According to FIG. 2, the integrated circuit structure 10 includes a nucleation layer 121, a first nitride semiconductor layer 122, a second nitride semiconductor layer 123, and a plurality of electrodes 101, 102, 103, 104, 201, 202, 203, 204. As will be described in greater detail below, the integrated circuit structure 10 includes at least one first transistor 100 of a first conductivity type (e.g., N-channel or N-type) formed in or on a first region 124 of the first nitride semiconductor layer 122, and at least one second transistor 200 of a second conductivity type (e.g., P-channel or P-type) formed in or on a second region 125 of the first nitride semiconductor layer 122. As the transistors 100, 200 are formed on the same semiconductor layer (i.e.,
the first nitride semiconductor layer 122), the integrated circuit structure 10 and the transistors 100, 200 are all considered as being monolithically integrated. Besides, as the transistors 100, 200 are of different conductivity types, the integrated circuit structure 10 may be considered as a complementary integrated circuit. Furthermore, as a base layer on which the transistors 100, 200 are formed is the first nitride semiconductor layer 122, the integrated circuit structure 10 may be referred to as a complementary nitride integrated circuit structure in the present disclosure.

Exemplarily, the nucleation layer 121 may be an AlN layer. Optionally, the nucleation layer may also be absent. The first nitride semiconductor layer 122 may be formed of dopant-free GaN. Optionally, the first nitride semiconductor layer 122 may also include one or more nitride semiconductor sub-layers, which may be formed of GaN, InN, AlN, AlGaN, InAlN, InGaN, AlGaInN, or other suitable alloy materials. The first nitride semiconductor layer 122 may have a thickness in the range of 1 micrometer to 10 micrometers. Optionally, the first nitride semiconductor layer 122 may be thicker or thinner. It should be noted that the numerical ranges set forth in the present disclosure are only examples but not limitations to the present disclosure. In addition, the first region 124 of the first nitride semiconductor layer 122 is a region away from the nucleation layer 121, and the second region 125 of the first nitride semiconductor layer 122 is a region opposite or adjacent to the nucleation layer 121. Surfaces of the first region 124 and the second region 125 are different crystal faces, for example, the former is a (0001) face, and the latter is a (000$\bar{1}$) face. In other words, the first region 124 and the second region 125 of the first nitride semiconductor layer 122 are of different crystal orientations, for example, the former has a <0001> crystal orientation, the latter has a <000$\bar{1}$> crystal orientation, and the <0001> crystal orientation and the <000$\bar{1}$> crystal orientation are opposite to each other.

In order to enhance the mechanical stability of the nitride integrated circuit structure 10, the first nitride semiconductor layer 122 may be allowed to be epitaxial on another substrate 120. The substrate 120 may be a silicon substrate, a sapphire substrate, a silicon carbide substrate, a gallium nitride substrate, or the like. In other words, the substrate that may be used to realize epitaxial growth of the first nitride semiconductor layer 122 may be formed of silicon, sapphire, silicon carbide, gallium nitride, or any other suitable materials. Optionally, the first nitride semiconductor layer 122 itself may include the substrate 120. Therefore, the term "first nitride semiconductor layer" used in the present disclosure may refer to a gallium nitride substrate or a nitride semiconductor layer grown on a substrate. Optionally, in order to tune a threshold voltage or to realize the normally-off characteristic, or in order to realize ohmic contact, the first nitride semiconductor layer 122 may be appropriately doped, which will be further discussed in detail later.

The second nitride semiconductor layer 123 is formed on the first nitride semiconductor layer 122, and forms a laminated structure with the first region 124 and the second region 125 of the first nitride semiconductor layer 122, respectively. The second nitride semiconductor layer 123 is a barrier layer, or a carrier supply layer, which, for example, may be formed of an alloy of a group III nitride. Optionally, the second nitride semiconductor layer 123 may include one or more nitride semiconductor sub-layers, which may be formed of AlGaN, InAlN, InGaN, AlN, or other suitable alloy materials. The second nitride semiconductor layer 123 may be formed of an AlGaN alloy with aluminum atoms in percentage ranging about 20% to 30%. Optionally, the percentage of aluminum may be lower or higher.

The first nitride semiconductor layer 122 has a first band gap, and the second nitride semiconductor layer 123 has a second band gap, which is larger than the first band gap. The first nitride semiconductor layer 122, for example, a GaN layer, may have a band gap of about 3.4 eV, and the second nitride semiconductor layer 123, for example, an AlGaN layer, may have a band gap of about 4.0 eV. Optionally, the band gap of the second nitride semiconductor layer 123 may be higher or lower. In any case, the band gaps of the first nitride semiconductor layer 122 and the second nitride semiconductor layer 123 are different from each other. Thus, the first region 124 of the first nitride semiconductor layer 122 and the second nitride semiconductor layer 123 have a first polarized junction 126 at a contact interface, forming the first nitride semiconductor structure; the second region 125 of the first nitride semiconductor layer 122 and the second nitride semiconductor layer 123 have a second polarized junction 127 at a contact interface, forming the second nitride semiconductor structure. In other words, the first nitride semiconductor structure includes a laminated structure of the first region 124 of the first nitride semiconductor layer 122 and the second nitride semiconductor layer 123, and this laminated structure may be a laminated structure of a plurality of sub-layers; the second nitride semiconductor structure includes a laminated structure of the second region 125 of the first nitride semiconductor layer 122 and the second nitride semiconductor layer 123, and this laminated structure may be a laminated structure of a plurality of sub-layers. Optionally, the laminated structure, for example, may be a laminated structure of a first sub-layer/a second sub-layer of the first nitride semiconductor layer 122 and a first sub-layer/a second sub-layer of the second nitride semiconductor layer 123. The first nitride semiconductor structure and the second nitride semiconductor structure are formed simultaneously or separately. Due to the existence of the spontaneous polarization and piezoelectric polarization effect, and lack of inverse symmetry of the first nitride semiconductor layer 122 and the second nitride semiconductor layer 123, the crystal faces, namely, (0001) face and the (000$\bar{1}$) face, perpendicular to the <0001> crystal orientation or the <000$\bar{1}$> crystal orientation are polarized faces, and a polarized junction is formed in a transition region where the two are in contact, respectively.

With continued reference to FIG. 2, the first polarized junction 126 and the second polarized junction 127 have different crystal orientations, for example, the former has a <0001> crystal orientation, the latter has a <000$\bar{1}$> crystal orientation, and the first polarized junction 126 and the second polarized junction 127 each have a vertical interface. Correspondingly, there are very strong polarized positive charges at the vertical interface of the first polarized junction 126, and there are very strong polarized negative charges at the vertical interface of the second polarized junction 127, thus, due to the presence of these polarized positive charges or negative charges, they are attracted to cause the generation of the two-dimensional electron gas (which may be referred to as a first conductivity type or a second conductivity type, for example) and the two-dimensional hole gas (which may be correspondingly referred to as a second conductivity type or a first conductivity type, for example) at the interface, respectively. As will be described in greater detail below, the two-dimensional carrier gas of the first conductivity type and the two-dimensional carrier gas of the second conductivity type form a carrier channel in a direction parallel to the first polarized junction 126 and in a direction parallel to the second polarized junction 127, respectively. In the above, the two-dimensional electron gas is located in a region corresponding to the conductive channel 105 of the first transistor 100, and supplies a current flowing between the first source electrode 101 and the first drain electrode 103 of the first transistor 100; and the two-dimensional hole gas is located in a region corresponding to the conductive channel 205 of the second transistor 200, and supplies a current flowing between the second source electrode 201 and the second drain electrode 203 of the second transistor 200.

With continued reference to FIG. 2, the plurality of electrodes 101, 102, 103, 104, 201, 202, 203, 204 in the preceding are provided on the first nitride semiconductor structure and the second nitride semiconductor structure, respectively. The first source electrode 101 and the first drain electrode 103 are distributed opposite to each other on either side of the first gate electrode 102, and are coupled with the two-dimensional carrier gas of the first conductivity type, to form at least one first transistor 100. The second source electrode 201 and the second drain electrode 203 are distributed opposite to each other on either side of the second gate electrode 202, and are coupled with the two-dimensional carrier gas of the second conductivity type, to form at least one second transistor 200. Optionally, the first transistor 100 further includes a first body electrode 104, which is provided opposite to the first gate electrode 102 on a side surface of the first nitride semiconductor structure; and the second transistor 200 further includes a second body electrode 204, which is provided opposite to the second gate electrode 202 on a side surface of the second nitride semiconductor structure.

Optionally, the first nitride semiconductor layer 122 further includes at least one doped region 150 of the second conductivity type (for example, P-type), which at least partially overlaps the first gate electrode 102 in a projection direction of the <0001> crystal orientation, and is electrically coupled with the two-dimensional carrier gas of the first conductivity type, so as to substantially deplete the two-dimensional carrier gas of the first conductivity type to realize that the first transistor 100 is of a normally-off type. In order to control the threshold voltage of the first transistor 100, it may also be provided that the first body electrode 104 is electrically connected to the doped region 150 of the second conductivity type (for example, P-type). Optionally, the first nitride semiconductor layer 122 further includes at least one doped region 140 of the first conductivity type (for example, N-type), which at least partially overlaps the second gate electrode 202 in a projection direction of the <000$\bar{1}$> crystal orientation, and is electrically coupled with the two-dimensional carrier gas of the second conductivity type, so as to substantially deplete the two-dimensional carrier gas of the second conductivity type to realize that the second transistor 200 is of the normally-off type. In order to control the threshold voltage of the second transistor 200, it may also be provided that the second body electrode 204 is electrically connected to the doped region 140 of the first conductivity type (for example, N-type). Optionally, the first nitride semiconductor layer 122 may simultaneously include at least one doped region 150 of the second conductivity type (for example, P-type) and the doped region 140 of the first conductivity type (for example, N-type), which substantially deplete the two-dimensional carrier gas in the vicinity of the first gate electrode 102 and the second gate electrode 202, respectively, so as to simultaneously realize that the first transistor 100 and the second transistor 200 are of the normally-off type.

Figure 3:
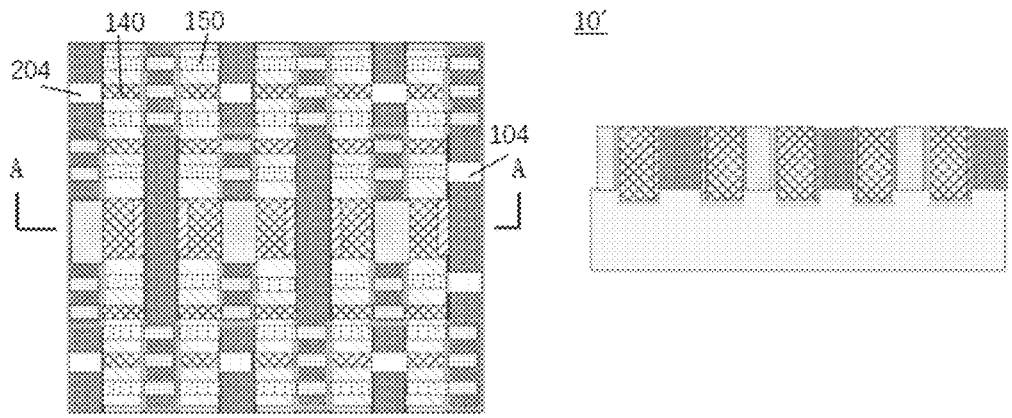
FIG. 3 is a plan view and a sectional view in A-A direction of an optional integrated circuit structure 10' of a group III nitride semiconductor.

FIG. 3 shows a plan view and a sectional view in A-A direction of another integrated circuit structure 10' of a group III nitride semiconductor. Optionally, a plurality of doped regions 140 of the first conductivity type (for example, N-type) and a plurality of doped regions 150 of the second conductivity type (for example, P-type) may be alternately formed in the first nitride semiconductor layer 122. In the first transistor 100, the doped regions 150 of the second conductivity type (for example, P-type) at least partially overlap the first gate electrode 102 in a projection direction of the <0001> crystal orientation, and substantially deplete the two-dimensional carrier gas of the first conductivity type in the vicinity of the first gate electrode 102, and the doped regions 140 of the first conductivity type (for example, N-type) are electrically coupled with the first source electrode 101 and the first drain electrode 103, respectively. In the second transistor 200, the doped regions 140 of the first conductivity type (for example, N-type) at least partially overlap the second gate electrode 202 in a projection direction of the <0001> crystal orientation, and substantially deplete the two-dimensional carrier gas of the second conductivity type in the vicinity of the second gate electrode 102, and the doped regions 150 of the second conductivity type (for example, P-type) are electrically coupled with the second source electrode 201 and the second drain electrode 203, respectively.

Various additional circuit elements that may be electrically coupled with the first transistor 100 and the second transistor 200 so as to form various types of electrical circuits are discussed below in conjunction with FIGS. 4-7. Although FIGS. 4-7 exemplarily show various circuits utilizing the complementary integrated circuit structure of FIG. 2, it should be understood that various circuit implementations of FIGS. 4-7 may also utilize the complementary integrated circuit structure of FIG. 3.

Figure 4:
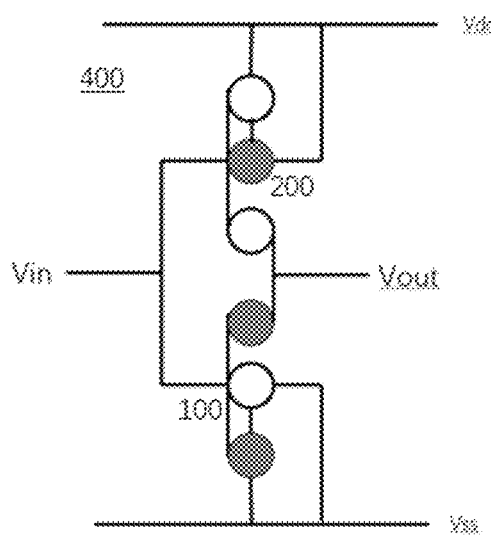
FIG. 4 is a schematic diagram of an optional phase inverter circuit structure having additional electrical connections and circuit elements.

FIG. 4 illustrates a phase inverter circuit structure having additional electrical connections and circuit elements. A phase inverter circuit structure 400 includes one first transistor 100 and one second transistor 200, wherein the first transistor and the second transistor are connected in series, and the first transistor 100 and the second transistor 200 have the circuit structure of FIG. 2 or FIG. 3. Optionally, the first transistor 100 is an HEMT, the second transistor 200 is an HHMT, wherein the first gate electrode 102 and the second gate electrode 202 are connected together as an input terminal $V_{in}$, the first source electrode 101 is coupled with ground or an external negative power supply $V_{SS}$, the second source electrode 201 is coupled with an external positive power supply $V_{DD}$, and the first drain electrode 103 and the second drain electrode 203 are connected together as an output terminal.

Figure 5:
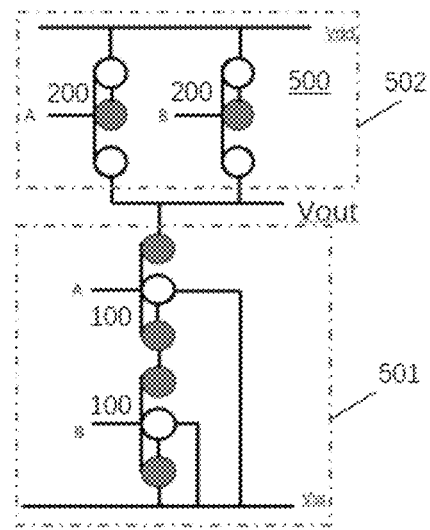
FIG. 5 is a schematic diagram of an optional NAND gate circuit structure having additional electrical connections and circuit elements.

FIG. 5 illustrates a NAND gate circuit structure having additional electrical connections and circuit elements. A NAND gate circuit structure 500 includes at least two first transistors 100 and at least two second transistors 200, and the first transistors 100 and the second transistors 200 have the circuit structure of FIG. 2 or FIG. 3. Optionally, the first transistor 100 is an HEMT and the second transistor 200 is an HHMT. At least two first transistors 100 are connected in series as a first unit 501, at least two second transistors 200 are connected in parallel as a second unit 502, and a connection terminal where the first unit 501 and the second unit 502 are connected in series serves as an output terminal Vout. In addition, the first transistors 100 of the first unit and the second transistors 200 of the second unit are in complementary pairing, and the gate electrodes 102, 202 of two transistors in complementary pairing are connected together as input terminals A, B, respectively. More specifically, a plurality of first transistors 100 in the first unit are connected in series in sequence, wherein one first source electrode 101 is coupled with ground or an external negative power supply $V_{SS}$, and one first drain electrode 103 serves as an output terminal Vout of the first unit 501 and is electrically coupled with the second unit 502. A plurality of second transistors 200 in the second unit 502 are connected in parallel, wherein the plurality of second drain electrodes 203 are connected together as an output terminal Vout and are electrically coupled with the first unit 501, and the plurality of second source electrodes 201 are connected together to be coupled with an external positive power supply $V_{DD}$.

Figure 6:
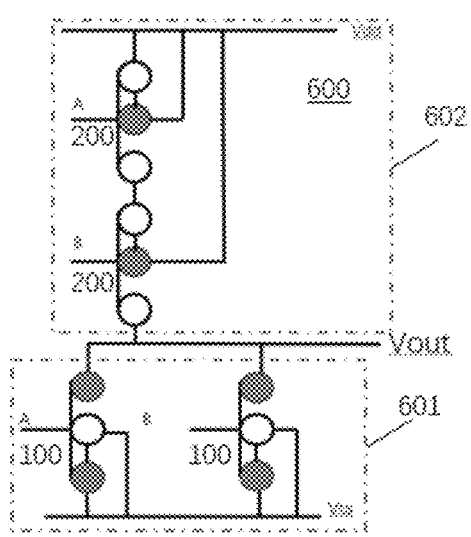
FIG. 6 is a schematic diagram of an optional NOR gate circuit structure having additional electrical connections and circuit elements.

FIG. 6 illustrates a NOR gate circuit structure having additional electrical connections and circuit elements. A NOR gate circuit structure 600 includes at least two first transistors 100 and at least two second transistors 200, and the first transistors 100 and the second transistors 200 have the circuit structure of FIG. 2 or FIG. 3. Optionally, the first transistor 100 is an HEMT and the second transistor 200 is an HHMT. At least two first transistors 100 are connected in parallel as a first unit 601, at least two second transistors 200 are connected in series as a second unit 602, and a connection terminal where the first unit 601 and the second unit 602 are connected in series serves as an output terminal Vout. In addition, the first transistors 100 of the first unit 601 and the second transistors 200 of the second unit 602 are in complementary pairing, and the gate electrodes 102, 202 of the two transistors in complementary pairing are connected together as input terminals A, B, respectively. More specifically, a plurality of first transistors 100 in the first unit 601 are connected in parallel, wherein a plurality of first source electrodes 101 are connected together and coupled with ground or an external negative power supply $V_{SS}$, and a plurality of first drain electrodes 103 are connected together and serves as an output terminal Vout of the first unit 601, to be electrically coupled with the second unit 602. A plurality of second transistors 200 in the second unit 602 are connected in series in sequence, wherein one first source electrode 101 is coupled with an external positive power supply $V_{DD}$, and one first drain electrode 103 serves as an output terminal Vout of the second unit 602, to be electrically coupled with the first unit 601.

Figure 7:
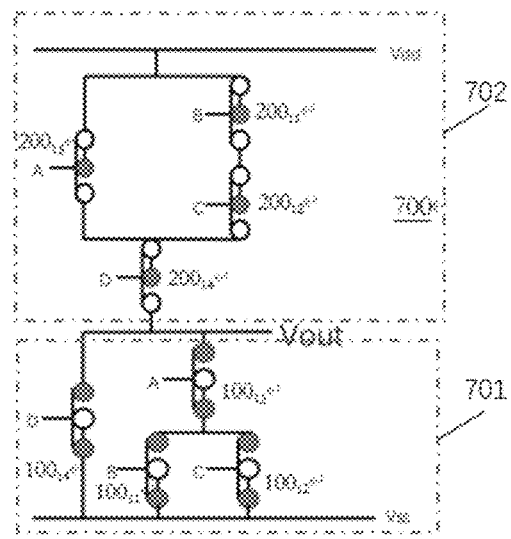
FIG. 7 is a schematic diagram of an optional complex CMOS circuit structure having additional electrical connections and circuit elements.

FIG. 7 illustrates a complex CMOS circuit structure having additional electrical connections and circuit elements. A complex CMOS circuit structure 700 includes at least two first transistors 100 and at least two second transistors 200, and the first transistors 100 and the second transistors 200 have the circuit structure of FIG. 2 or FIG. 3. Optionally, the first transistor 100 is an HEMT and the second transistor 200 is an HHMT. The plurality of first transistors 100 are connected in series or in parallel in any number and serve as a first unit 701. The plurality of second transistors 200 are in complementary pairing with the plurality of first transistors 100 in the first unit 701, and connected in parallel or in series correspondingly in any number, and serve as a second unit 702. A connection terminal where the first unit 701 and the second unit 702 are connected in series serves as an output terminal Vout. In addition, the gate electrodes 102, 202 of the two transistors in complementary pairing in the preceding are connected together as input terminals A, B, C, and D, respectively. More specifically, there are four first transistors 100 in the first unit 701, which are respectively referred to as first transistors $100_{11}$, $100_{12}$, $100_{13}$, and $100_{14}$, and there are four second transistors 200 in the second unit 702, which are in complementary pairing with the four first transistors, and respectively referred to as second transistors $200_{11}$, $200_{12}$, $200_{13}$, and $200_{14}$. The two first transistors $100_{11}$, $100_{12}$ in the first unit 701 are connected in parallel, and are connected in series with another first transistor $100_{13}$ to form a series unit, then the series unit is connected in parallel with the last first transistor $100_{14}$, the first source electrodes 101 thereof are connected together to be coupled with ground or an external negative power supply $V_{SS}$, and the first drain electrodes 103 thereof are connected together as an output terminal $V_{out}$ and are electrically coupled with the second unit 702. The two second transistors $200_{11}$, $200_{12}$ in the second unit 702 are connected in series to form a series unit, and then connected in parallel with another second transistor $200_{13}$ to form a parallel unit, the second source electrodes 201 thereof are connected together to be coupled with an external positive power supply $V_{DD}$, the parallel unit is then connected in series with the last second transistor $200_{14}$, and the second drain electrode 203 of $200_{14}$ serves as an output terminal $V_{out}$ of the second unit and is electrically coupled with the first unit 701.

Figure 32:
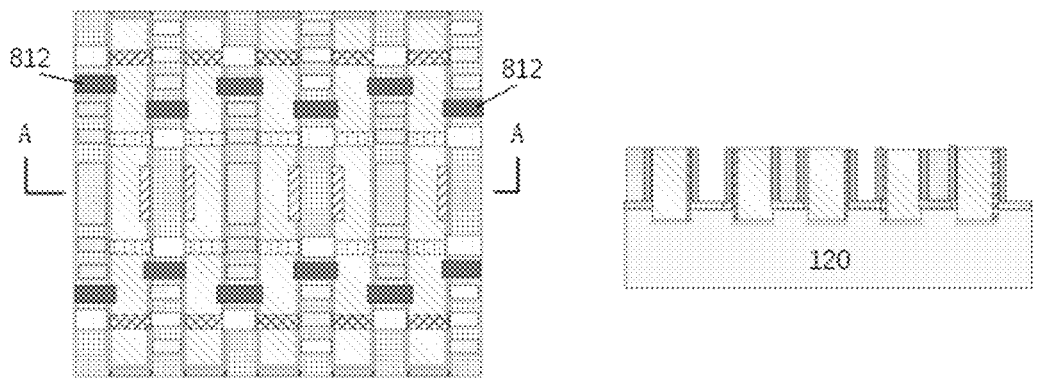

Moreover, although the first transistor 100 and the second transistor 200 are shown directly adjacent to each other, the two may be spatially separated from each other (although still on the same first nitride semiconductor layer 122), wherein any number of insertion devices, and/or one or more isolation structures may be present between the transistors 100, 200. For example, as shown in FIG. 32, the isolation structure may include an isolation groove and an isolation medium filling the groove.

In addition to the above examples in which a circuit of various complementary nitride integrated circuit structures 10 may be realized, various nitride integrated circuit structures 10 may be realized in electronic devices including various other types of circuits. Such circuits include, but are not limited to, AC to DC converters (rectifiers), DC to DC converters, DC to AC inverters, AC to AC converters, amplifiers, and various other types of circuits. Therefore, the examples given above are not intended to be limiting.

The nitride integrated circuit structure 10 may further include any combination of additional active and/or passive devices, including at least one first transistor 100 (e.g., HEMT) and at least one second transistor 200 (for example, HHMT), a diode, a resistor, a capacitor, an inductor, etc., which, along with any combination of conductive interconnection between various devices, can realize functions such as operation, amplification, transmission, conversion and logic.

A manufacturing method for manufacturing the above nitride integrated circuit structure 10 is described in detail below with reference to FIGS. 8-40. In order to realize the aforementioned complementary nitride integrated circuit structure 10, it is necessary to form an HEMT and an HHMT on a substrate, and preferably, the HEMT and the HHMT are simultaneously realized. Certainly, the HEMT and the HHMT may also be realized separately, and a normally-off transistor is realized by forming a channel structure containing a doped structure. Certainly, in principle, the normally-off transistor also may be realized by a doped nitride semiconductor gate electrode outside the channel structure. In the present disclosure, formation of a channel structure containing a doped structure is mainly described. In addition, in principle, to realize the HEMT and the HHMT simultaneously, there may be three process routes: a vertical channel obtained through unrestricted growth, a horizontal channel obtained through restricted growth of a horizontal groove, and a vertical channel obtained through restricted growth of the vertical groove. However, as the highest integration density may be obtained due to the restriction of the horizontal groove and the process is relatively simple, only this case is described in the present disclosure.

Figure 8:
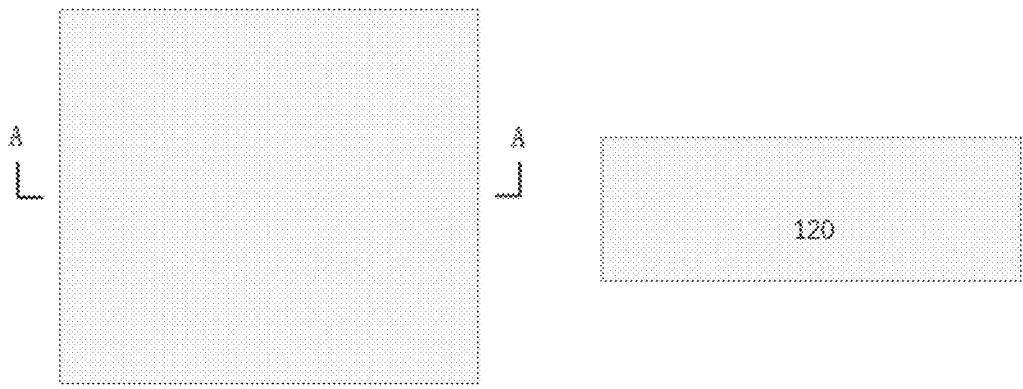
FIGS. 8-40 are schematic diagrams of a manufacturing method of a nitride integrated circuit structure.
Figure 9:
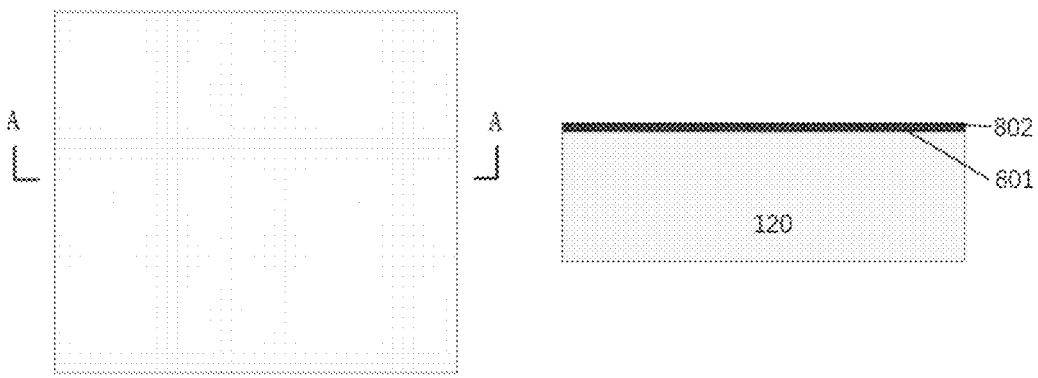

As shown in FIGS. 8-9, a substrate 120 is provided, wherein the substrate may be a silicon substrate employing either (110) or (112) face. Optionally, the substrate 120 may be a sapphire substrate, a silicon carbide substrate, a gallium nitride substrate, or the like. A first insulating layer 802 is formed on a first surface 801 of the substrate 120, and exemplarily, the first insulating layer 802 is a $SiO_2$ layer formed by thermal oxidation or vapor deposition. Exemplarily, the first insulating layer 802 has a thickness of about 0.5 microns. A photoresist layer is formed on the first insulating layer 802, and an opening through which the first insulating layer 802 below may be exposed is formed on the photoresist layer.

Figure 10:
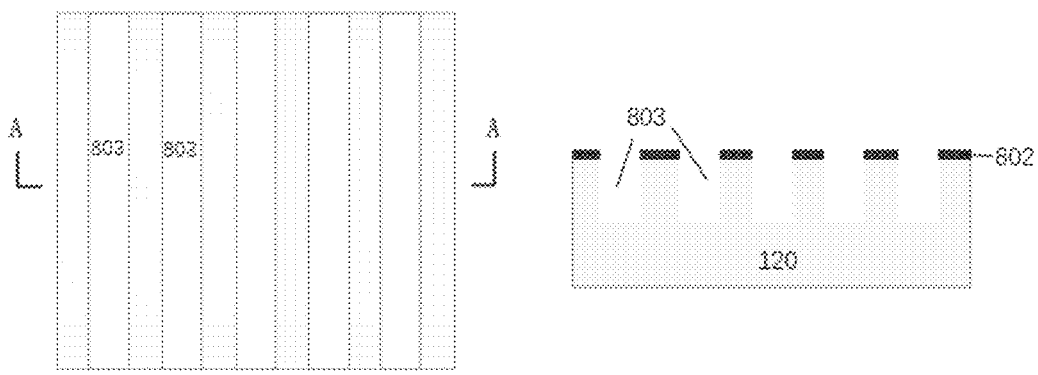

As shown in FIG. 10, at the opening formed on the photoresist layer on the first insulating layer 802, the first insulating layer 802 and the substrate 120 below the first insulating layer are etched to form a plurality of vertical first grooves 803, the first grooves 803 are arranged at intervals, and side walls of the first grooves have a hexagonal symmetrical lattice structure, for example, Si (111) face.

Figure 11:
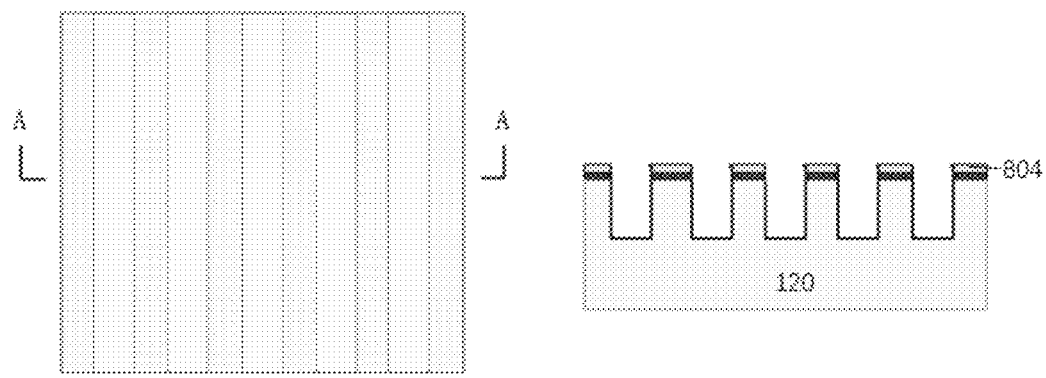

As shown in FIG. 11, on the basis of the structure formed in the preceding, a sacrificial layer 804 is formed by coplanar deposition, and exemplarily, the sacrificial layer 804 is a silicon nitride layer, and has a thickness of about 100 nanometers. It may be understood that the first insulating layer 802 and the sacrificial layer 804 may be selected as long as the two have a high etching selectivity ratio, for example, when etching the sacrificial layer 804, an etchant substantially does not etch the first insulating layer 802, or etches the first insulating layer extremely slow.

Figure 12:
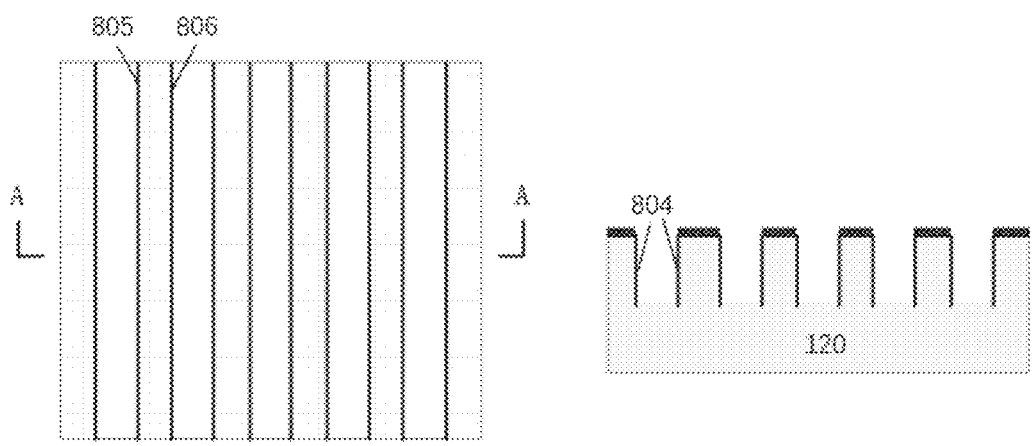

As shown in FIG. 12, dry etching is performed, to remove the sacrificial layer 804 on a surface of the first insulating surface 802 and the sacrificial layer 804 on the bottom of the first groove 803, and a side surface of the first groove 803 is retained, for example, the first sacrificial layer 804 on the first side surface 805 and the second side surface 806.

Figure 13:
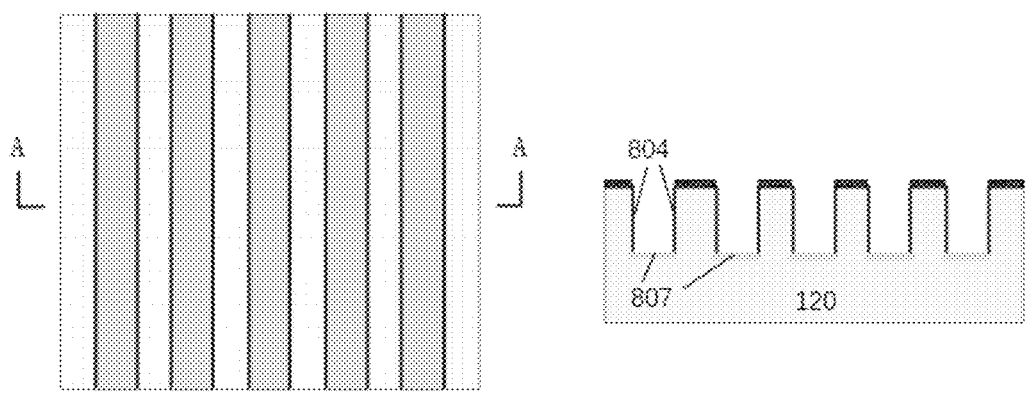

As shown in FIG. 13, a second insulating layer 807 (silicon dioxide layer) is formed on a bottom surface of the groove through an oxidation process, the side surface of the first groove 803, such as the first side surface 805 and the second side surface 806, is not oxidized due to the protection of the retained first sacrificial layer 804, and the second insulating layer 807 can avoid incompatibility between the gallium atoms and the silicon substrate when the nitride semiconductor is subsequently grown, thus avoiding the melt-back phenomenon. Meanwhile, the second insulating layer 807 further may effectively block a leakage current between the nitride semiconductor and the silicon substrate, and reduce the parasitic capacitance brought by the silicon substrate.

Figure 14:
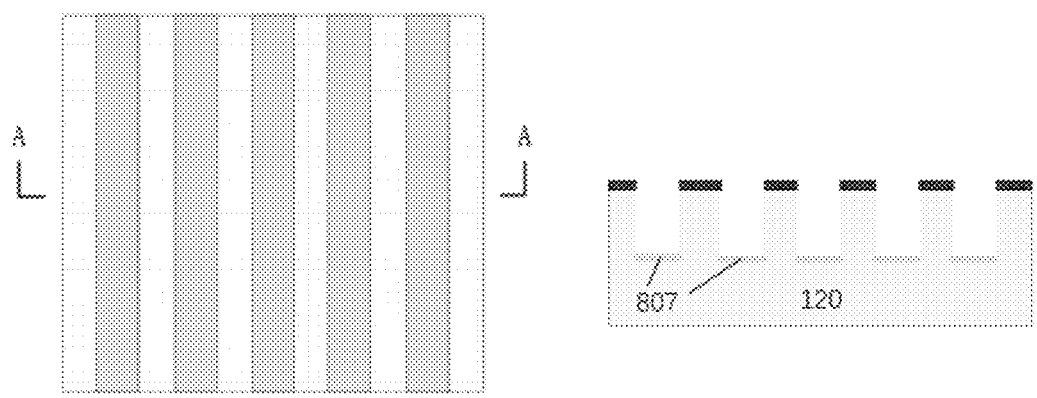

As shown in FIG. 14, the first sacrificial layer 804 on the side surfaces of the first groove 803, such as on the first and second side surfaces 805, 806, is removed by selective wet etching by utilizing an etching selectivity ratio of the first sacrificial layer 804 to the second insulating layer 807.

Figure 15:
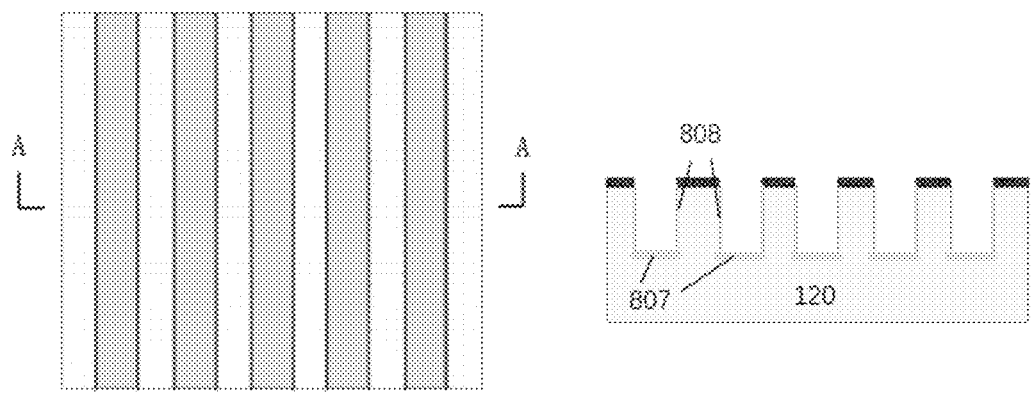

As shown in FIG. 15, a thinner third insulating layer 808 (silicon dioxide layer) is respectively formed on the first and second side surfaces 805, 806 of the first groove 803 through an oxidation process, and the thickness of the third insulating layer 808 is set to be different from the thickness of the first and second insulating layers. The thickness of the third insulating layer 808 satisfies that when the third insulating layer 808 is subsequently removed, there are still sufficiently thick first and second insulating layers to protect the substrate. These insulating layers may avoid incompatibility between the gallium atoms and the silicon substrate during subsequent growth of the nitride semiconductor, so as to avoid the melt-back phenomenon, which are essential for fabricating the nitride semiconductor device on the silicon substrate.

Figure 16:
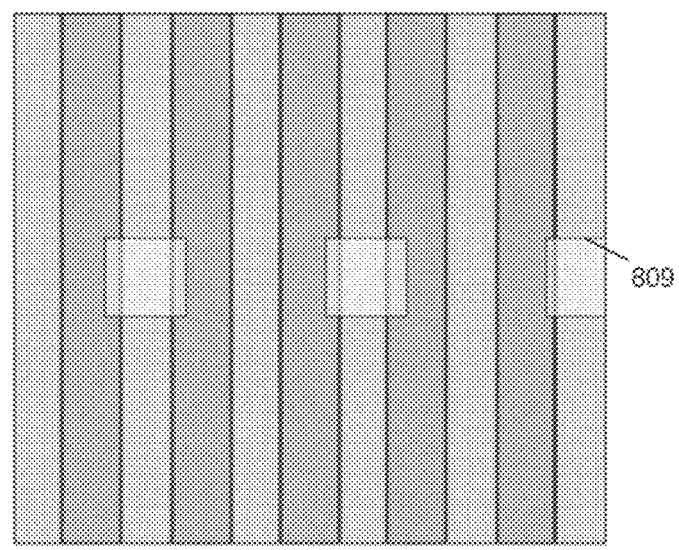

As shown in FIG. 16, a photoresist 809 is coated on the foregoing structure, and a photolithographic pattern is formed between the first grooves 803, through an exposure and development process well known to those skilled in the art, to expose a part of the third insulating layer 808 and the first insulating layer 802 between the first grooves 803.

Figure 17:
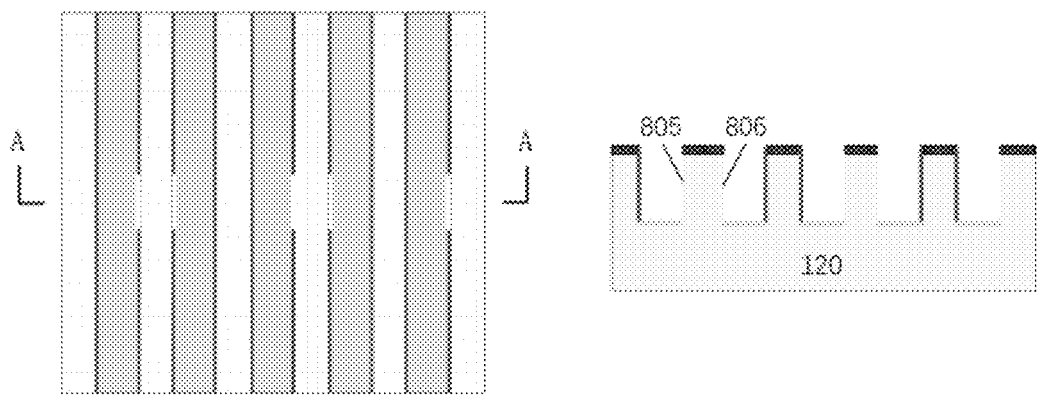

As shown in FIG. 17, the part of the exposed third insulating layer 808 and the exposed first insulating layer 802 on the side surfaces of the plurality of first grooves 803 are removed. As the thickness of the first insulating layer 802 is much greater than that of the third insulating layer 808, in the process of removing a part of the third insulating layer 808, the exposed first insulating layer 802 is only etched by a small thickness and is not completely removed. The remaining photoresist 809 is then removed so that a part of the side surfaces 805, 806 of the substrate 120 are exposed in the first groove 803.

Figure 18:
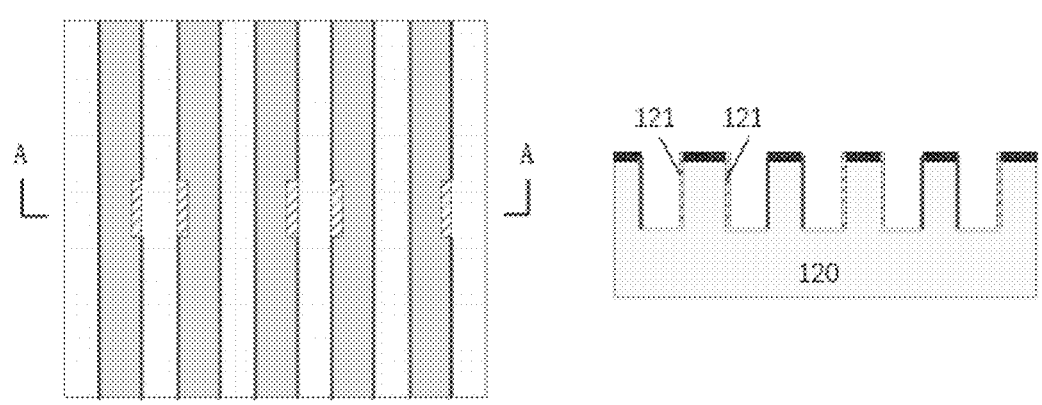

As shown in FIG. 18, the GaN cannot be directly deposited on the silicon substrate due to the melt-back effect between the silicon substrate and gallium. Generally, a nucleation layer of AlN needs to be deposited first, and then a subsequent nitride semiconductor structure is formed on this basis. Therefore, a single crystal AlN nucleation layer 121 is formed on the exposed side surfaces 805, 806 of the first groove 803, respectively, and a growth direction of the single crystal AlN crystal is <0001>, and a surface thereof is a (0001) face. It should be noted that the selectivity of AlN is very low, and it is easy to also generate polycrystalline or amorphous AlN on the insulating layer under common process conditions, which is disadvantageous for forming a desired structure. Therefore, it is necessary to additionally remove the AlN on the silicon dioxide layer after the nucleation layer is formed. Alternatively, a chlorine-containing gas is introduced while the AlN nucleation layer is grown so as to ensure growth only on the silicon substrate but not on the silicon dioxide layer.

It may be understood that if other substrates such as $Al_2O_3$ are used, the nucleation layer may also be GaN. In this case, nucleation only on the surface of the exposed substrate may be easily achieved through process adjustment.

Figure 19:
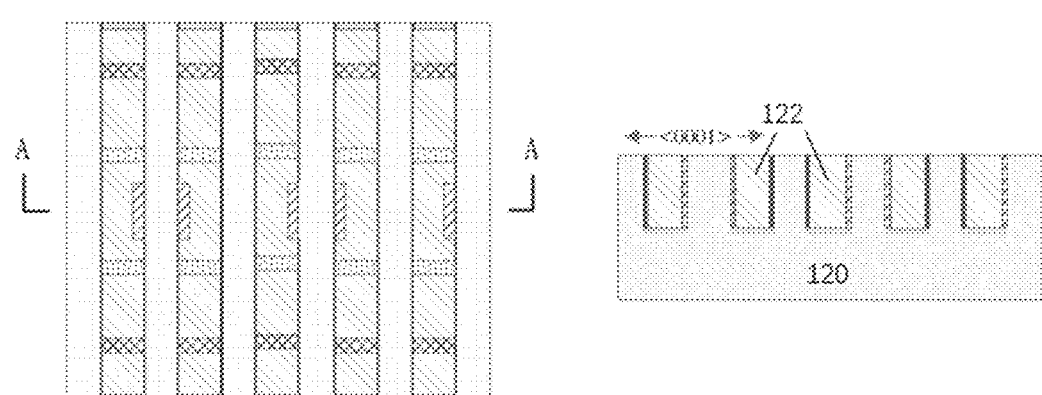

As shown in FIG. 19, a first nitride semiconductor layer 122 is then epitaxially grown laterally with the nucleation layer 121 as a core, and due to the presence of the first grooves 803, the first nitride semiconductor layer 122 starts to be epitaxially grown laterally along the first grooves 803 from the nucleation layer, wherein a growth direction is <0001>, and the <0001> crystal orientation and the <000$\bar{1}$> crystal orientation are opposite to each other. The first nitride semiconductor layer 122 may be further grown outside the grooves, and the first nitride semiconductor layer 122 outside the first grooves 803 is removed by a planarization or etching technique. The lateral epitaxy may effectively improve the nitride semiconductor crystal quality in a lateral epitaxial region, and further improve the electrical performance of the device. The first nitride semiconductor layer 122 outside the grooves is removed. It may be understood that the grown first nitride semiconductor layer 122 outside the first grooves 803 also may not be removed, and forms a part protruding from the first grooves 803.

According to the present embodiment, the first nitride semiconductor layer 122 may be formed of dopant-free GaN. Optionally, the first nitride semiconductor layer 122 may also include one or more nitride semiconductor sublayers, which may be formed of GaN, InN, AlN, AlGaN, InAlN, InGaN, AlGaInN, or other suitable alloy materials. The first nitride semiconductor layer 122 may have a thickness in a range of 1.0 micrometers to 10 micrometers. Optionally, the first nitride semiconductor layer 122 may be thicker or thinner. It should be noted that the numerical ranges set forth in the present disclosure are only examples but not limitations to the present disclosure.

It may be understood that before the first nitride semiconductor layer is grown, a buffer layer further may be formed first by deposition, and certainly, it is also feasible that the buffer layer is not formed.

Optionally, at least one doped region 150 of the second conductivity type (for example, P-type) further may be formed on the first nitride semiconductor layer 122, which at least partially overlaps the above-mentioned first gate electrode 102 in a projection direction of <0001> crystal orientation, and is electrically coupled with the two-dimensional carrier gas of the first conductivity type, so as to substantially deplete the two-dimensional carrier gas of the first conductivity type to realize that the first transistor 100 is of a normally-off type. The doping concentration, size parameter, and so on of the doped region 150 of the second conductivity type may be set through the device parameters so as to satisfy that the two-dimensional carrier gas of the first conductivity type is substantially depleted, that is, 95%-100% of the two-dimensional carrier gas of the first conductivity type is depleted. When the concentration of the two-dimensional carrier gas of the first conductivity type is higher, the corresponding doping concentration may be improved accordingly.

Optionally, at least one doped region 140 of the first conductivity type (for example, N-type) further may be formed on the first nitride semiconductor layer 122, which at least partially overlaps the above-mentioned second gate electrode 202 in a projection direction of <000$\bar{1}$> crystal orientation, and is electrically coupled with the two-dimensional carrier gas of the second conductivity type, so as to substantially deplete the two-dimensional carrier gas of the second conductivity type to realize that the second transistor 200 is of the normally-off type. The doping concentration, size parameter, and so on of the doped region 140 of the first conductivity type (for example, N-type) may be set through the device parameters so as to satisfy that the two-dimensional carrier gas of the second conductivity type is substantially depleted, that is, 95%-100% of the two-dimensional carrier gas of the second conductivity type is depleted. When the concentration of the two-dimensional carrier gas of the second conductivity type is higher, the corresponding doping concentration may be improved accordingly.

Optionally, at least one doped region 150 of the second conductivity type (for example, P-type) and doped region 140 of the first conductivity type (for example, N-type) further may be simultaneously formed on the first nitride semiconductor layer 122, which substantially deplete the two-dimensional carrier gas in the vicinity of the first gate electrode 102 and the second gate electrode 202, respectively, so as to simultaneously realize that the first transistor 100 and the second transistor 200 are of the normally-off type.

Figure 20:
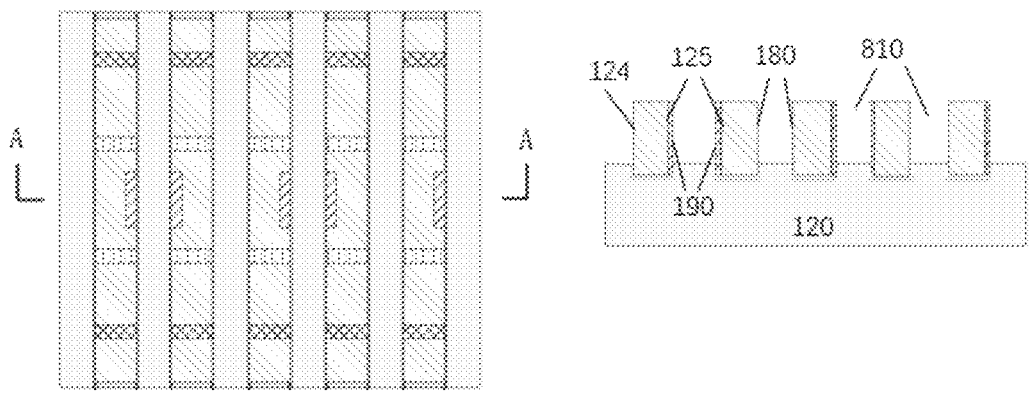

As shown in FIG. 20, a silicon substrate 120 between the first nitride semiconductor layers 122 is etched, to remove the first insulating layer 802 and a part of the silicon substrate 120, so as to form a plurality of second grooves 810. After the silicon substrate 120 is etched, except an outer side surface of the nucleation layer, the first nitride semiconductor layer 122 may also have the third insulating layer 808. Here, the third insulating layer 808 may be removed, thereby exposing the side surfaces 180, 190 of the first nitride semiconductor layer 122 in the <0001> and <000$\bar{1}$> directions, of which corresponding crystal faces are (0001) face and (000$\bar{1}$) face, respectively. In other words, the side surface 180 of the first nitride semiconductor layer 122 in the <0001> direction is the first region 124 of the first nitride semiconductor layer 122, and the side surface 190 of the first nitride semiconductor layer 122 in the <000$\bar{1}$> direction is the second region 125 of the first nitride semiconductor layer 122. Optionally, the third insulating layer 808 also may be retained first and removed in a later step, which is not described herein again.

Figure 21:
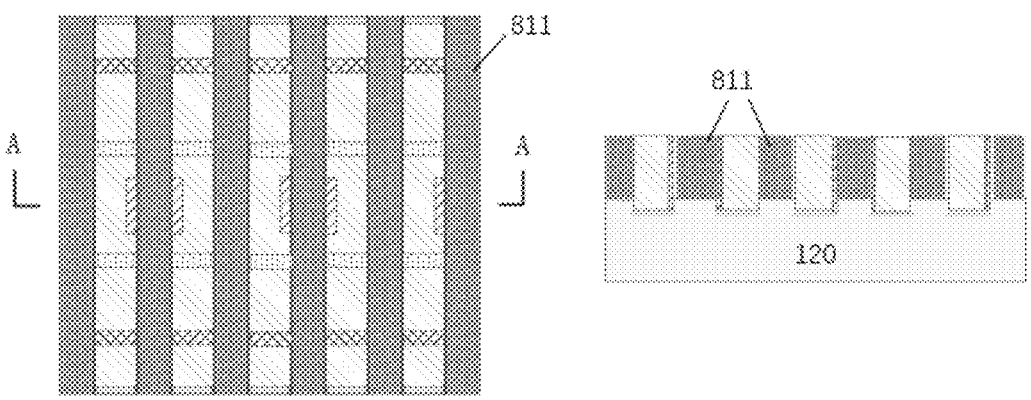

As shown in FIG. 21, a fourth insulating layer 811 is formed on the etched substrate 120 to fill the second grooves 810 and planarization is performed, so as to isolate the exposed silicon substrate. The fourth insulating layer 811 may be exemplarily a silicon dioxide layer.

Figure 22:
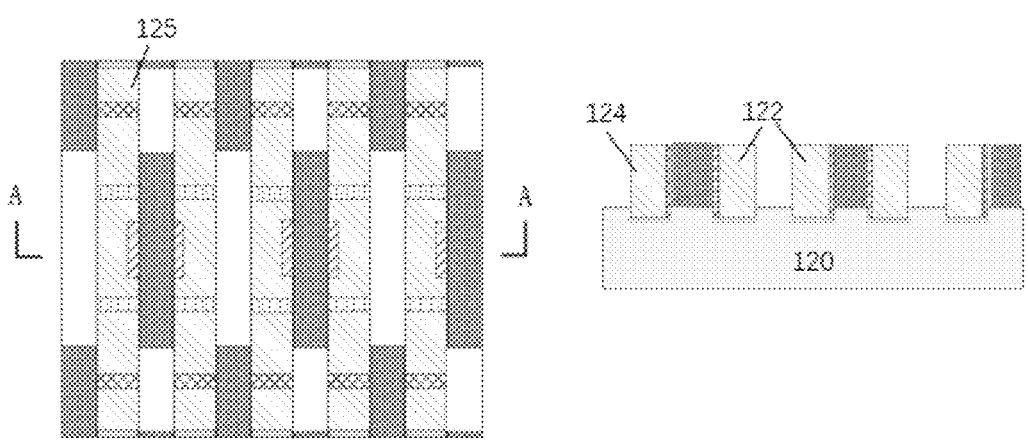

As shown in FIG. 22, a part of the fourth insulating layer 811 on the bottom portions and side walls in the second grooves 810 is etched to expose a part of the first region 124 and the second region 125 of the first nitride semiconductor layer 122.

Figure 23:
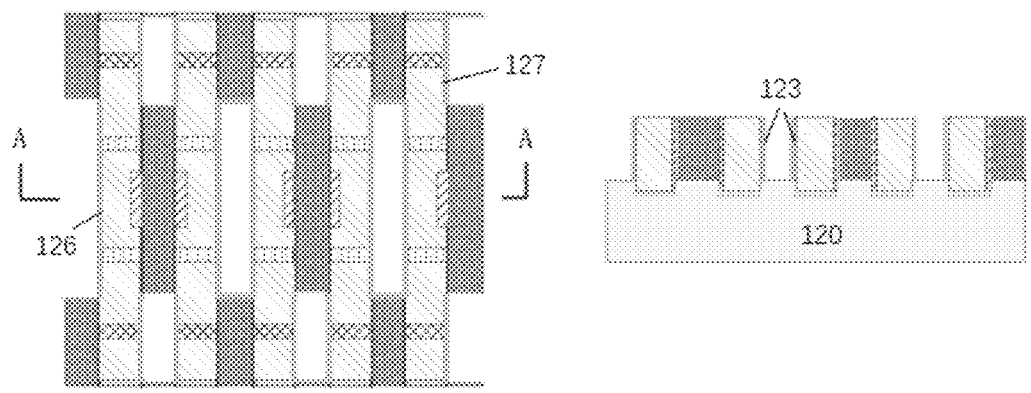

As shown in FIG. 23, a second nitride semiconductor layer 123 is then formed on the exposed first region 124 and second region 125 of the first nitride semiconductor layer 122, which forms a laminated structure respectively with the first region 124 and the second region 125 of the first nitride semiconductor layer 122. Optionally, the second nitride semiconductor layer 123 is a barrier layer or a carrier supply layer, and may include one or more nitride semiconductor sub-layers. The second nitride semiconductor layer 123 may be formed of AlGaN, InAlN, InGaN, AlN, or other suitable alloy materials. The second nitride semiconductor layer 123 may be formed of an AlGaN alloy with aluminum atoms in percentage ranging about 20% to 30%. Optionally, the percentage of aluminum may be lower or higher.

Optionally, the first nitride semiconductor layer 122 has a first band gap, and the second nitride semiconductor layer 123 has a second band gap, which is larger than the first band gap. The first nitride semiconductor layer 122, for example, a GaN layer, may have a band gap of about 3.4 eV, and the second nitride semiconductor layer 123, for example, an AlGaN layer, may have a band gap of about 4.0 eV. Optionally, the band gap of the second nitride semiconductor layer 123 may be higher or lower. In any case, the band gaps of the first nitride semiconductor layer 122 and the second nitride semiconductor layer 123 are different from each other.

Due to the existence of the spontaneous polarization and piezoelectric polarization effect, and lack of inverse symmetry of the first nitride semiconductor layer 122 and the second nitride semiconductor layer 123, the crystal faces, namely, (0001) face and the (000$\bar{1}$) face, perpendicular to the <0001> crystal orientation or the <000$\bar{1}$> crystal orientation are polarized faces, and a polarized junction is formed in a transition region where the two are in contact, respectively. Thus, the first region 124 of the first nitride semiconductor layer 122 and the second nitride semiconductor layer 123 have a first polarized junction 126 at a contact interface, forming the first nitride semiconductor structure; the second region 125 of the first nitride semiconductor layer 122 and the second nitride semiconductor layer 123 have a second polarized junction 127 at a contact interface, forming the second nitride semiconductor structure. In other words, the first nitride semiconductor structure includes a laminated structure of the first region 124 of the first nitride semiconductor layer 122 and the second nitride semiconductor layer 123, and this laminated structure may be a laminated structure of a plurality of sub-layers. The second nitride semiconductor structure includes a laminated structure of the second region 125 of the first nitride semiconductor layer 122 and the second nitride semiconductor layer 123, and this laminated structure may be a laminated structure of a plurality of sub-layers. Optionally, the laminated structure, for example, may be a laminated structure of a first sub-layer/a second sub-layer of the first nitride semiconductor layer 122 and a first sub-layer/a second sub-layer of the second nitride semiconductor layer 123. The first nitride semiconductor structure and the second nitride semiconductor structure are formed simultaneously.

Optionally, the first polarized junction 126 and the second polarized junction 127 have different crystal orientations, for example, the former has a <0001> crystal orientation, the latter has a <000$\bar{1}$> crystal orientation, and the first polarized junction 126 and the second polarized junction 127 each have a vertical interface. The two-dimensional carrier gas of the first conductivity type and the two-dimensional carrier gas of the second conductivity type form a carrier channel in a direction parallel to the first polarized junction 126 and in a direction parallel to the second polarized junction 127, respectively.

Figure 24:
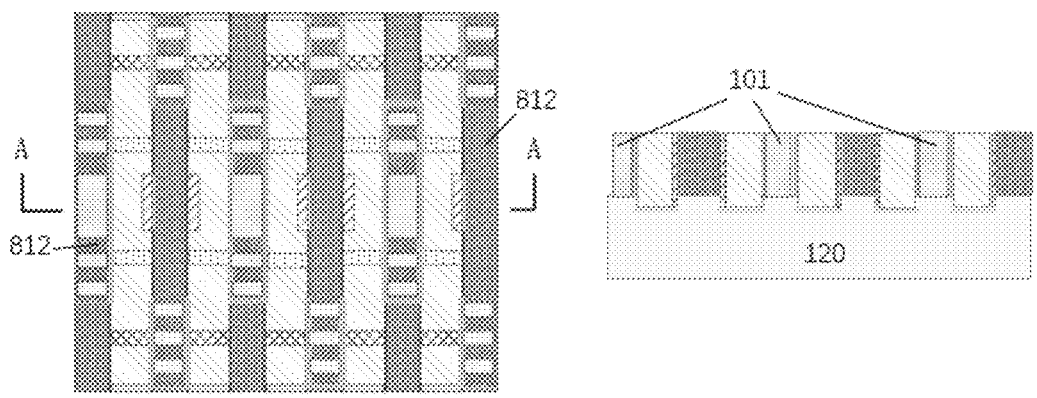

As shown in FIG. 24, a fifth insulating layer 812 is formed on the foregoing structure to fill the second grooves 810, and the fifth insulating layer 812 is subjected to photolithography to form a source electrode window, a drain electrode window, and a gate electrode window. As shown in FIG. 2, Ti, Al, Ti and TiN four layers of metal is evaporated in the source electrode window, the drain electrode window, and the gate electrode window, by adopting a technique known to a person skilled in the art, for example, the electron beam evaporation technology, for example, the thickness may be 20 nm, 130 nm, 25 nm, and 70 nm, and after peeling and annealing, an ohmic electrode in ohmic contact with the two-dimensional carrier gas, and a gate electrode insulated from or in Schottky contact with the second nitride semiconductor layer 123 are formed, that is, source electrodes 101, 201, drain electrodes 103, 203, and gate electrodes 102, 202 of the HEMT 100 and the HHMT 200 are formed. Specifically, the first source electrode 101 and the first drain electrode 103 are distributed opposite to each other on either side of the first gate electrode 102, and are coupled with the two-dimensional carrier gas of the first conductivity type, to form at least one first transistor 100. The second source electrode 201 and the second drain electrode 203 are distributed opposite to each other on either side of the second gate electrode 202, and are coupled with the two-dimensional carrier gas of the second conductivity type, to form at least one second transistor 200.

Figure 25:
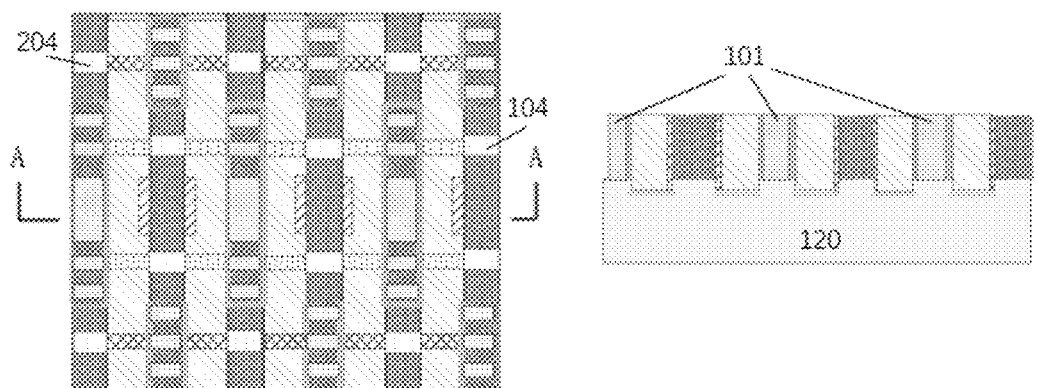

As shown in FIG. 25 and FIG. 3, in order to control the threshold voltage of the transistor, body electrodes 104, 204 further may be formed on the foregoing structure, which are respectively electrically connected to the doped region 150 of the second conductivity type (for example, P-type) and the doped region 140 of the first conductivity type (for example, N-type). Specifically, optionally, the first transistor 100 further includes a first body electrode 104, which is provided opposite to the first gate electrode 102 on a side surface of the first nitride semiconductor structure; and the second transistor 200 further includes a second body electrode 204, which is provided opposite to the second gate electrode 202 on a side surface of the second nitride semiconductor structure.

Optionally, a sixth insulating layer 811' may be formed through an oxidation process to isolate the silicon substrate 120 in the second groove above, in place of the fourth insulating layer 811. Specifically, the introduction is made on the basis of a structure obtained after etching a part of the silicon substrate, a structure as shown in FIG. 20, and the drawing is renumbered as FIG. 26. Hereinafter, only structures or methods different from the foregoing contents are introduced, and the contents having the same structures and methods are not described again in detail.

Figure 26:
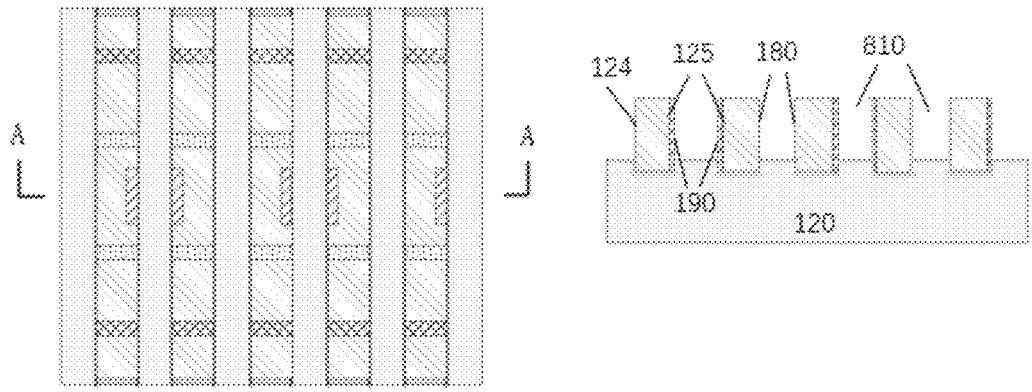
Figure 27:
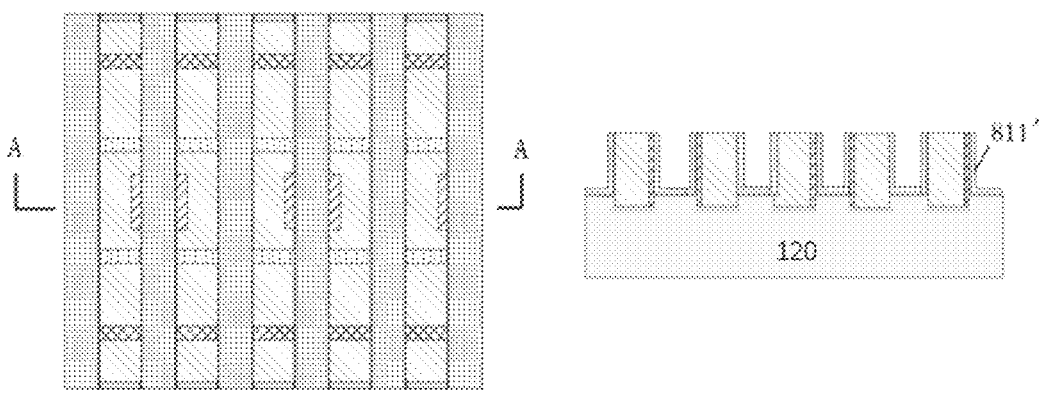

As shown in FIG. 27, the structure shown in FIG. 26 is oxidized, and a sixth insulating layer 811' is formed on the exposed silicon substrate 120 of the second grooves 810 and the side surface of the first nitride semiconductor layer 122. Since the nitride semiconductor is not easily oxidized, the sixth insulating layer 811' formed on the surface of the first nitride semiconductor layer 122 is relatively thin.

Figure 28:
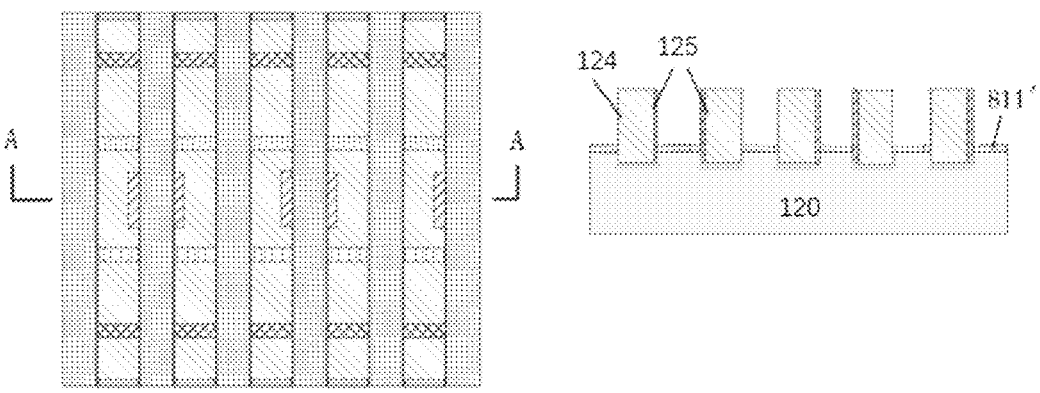

As shown in FIG. 28, the sixth insulating layer 811' surrounding the side surface of the first nitride semiconductor layer 122 is removed to expose the first region 124 and the second region 125 of a part of the first nitride semiconductor layer 122. The third insulating layer 808 on the side surface of the first nitride semiconductor layer 122 also may be retained first in the process of forming the structure of FIG. 20 (26). The third insulating layer may protect the side surface of the first nitride semiconductor layer 122 during the oxidation process shown in FIG. 27 and be removed in subsequent steps shown in FIG. 28.

Figure 29:
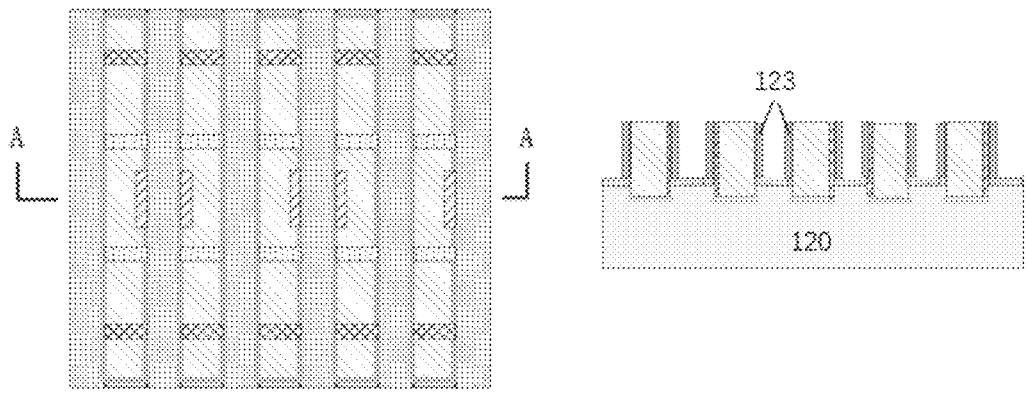

As shown in FIG. 29, a second nitride semiconductor layer 123 is then formed on the exposed first region 124 and second region 125 of the first nitride semiconductor layer 122, which forms a laminated structure respectively with the first region 124 and the second region 125 of the first nitride semiconductor layer 122. Optionally, the material of the second nitride semiconductor layer 123 is the same as that in the foregoing embodiment. Optionally, the laminated structure, for example, may be a laminated structure of a first sub-layer/a second sub-layer of the first nitride semiconductor layer 122 and a first sub-layer/a second sub-layer of the second nitride semiconductor layer 123. The first nitride semiconductor structure and the second nitride semiconductor structure are formed simultaneously.

Figure 30:
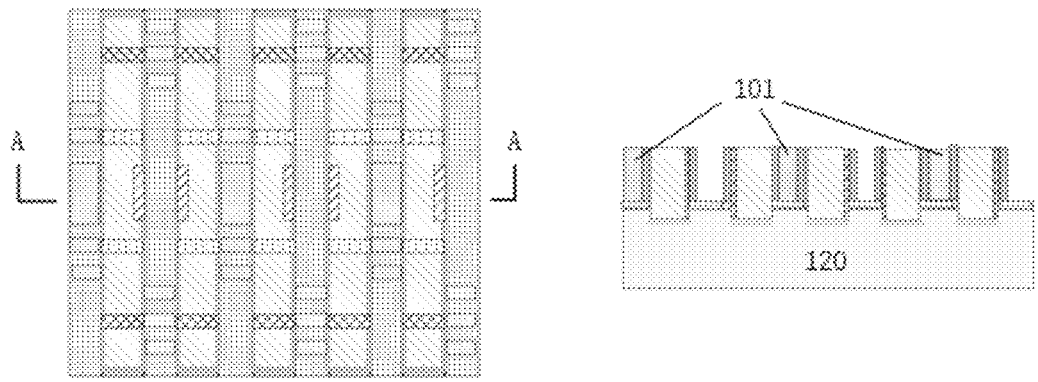

As shown in FIG. 30 and FIG. 2, a source electrode window, a drain electrode window, and a gate electrode window are formed on the foregoing structure. Ti, Al, Ti and TiN four layers of metal is evaporated in the source electrode window and the drain electrode window, by adopting a technique known to a person skilled in the art, for example, the electron beam evaporation technology, for example, the thickness may be 20 nm, 130 nm, 25 nm, and 70 nm, and after peeling and annealing, an ohmic electrode in ohmic contact with the two-dimensional carrier gas is formed, and TiN metal is evaporated in the gate electrode window so as to form a gate electrode insulated from or in Schottky contact with the second nitride semiconductor layer 123, that is, the source electrodes 101, 201, the drain electrodes 103, 203, and the gate electrodes 102, 202 of the HEMT 100 and the HHMT 200 are formed. These electrode structures may also be formed by etching.

Figure 31:
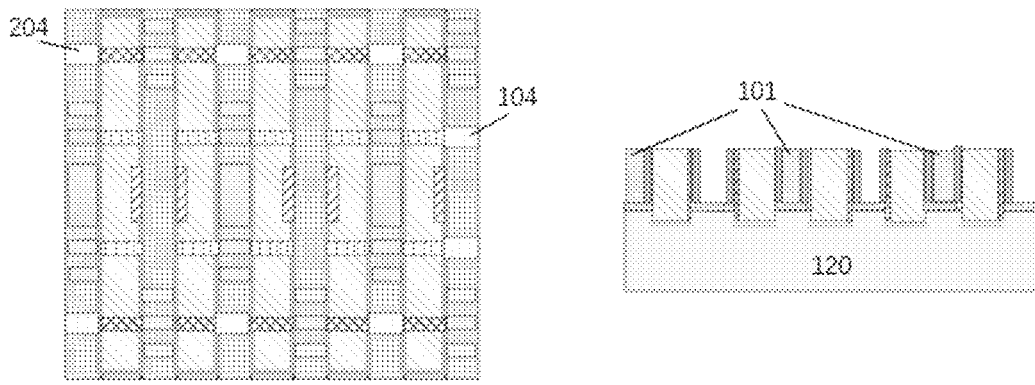

As shown in FIG. 31, in order to control the threshold voltage of the transistor, body electrodes 104, 204 further may be formed on the foregoing structure, which are respectively electrically connected to the doped region 150 of the second conductivity type (for example, P-type) and the doped region 140 of the first conductivity type (for example, N-type).

As shown in FIG. 32, the two-dimensional carrier gas between different transistors, i.e., 2DEG and 2DHG, is removed to prevent electrical connection between different transistors due to 2DEG and 2DHG. Specifically, grooves are formed between different transistors and filled with a seventh insulating medium 812 to form groove isolation structures by utilizing a technique well known in the art, for example, inductively coupled plasma etching (i.e., ICP etching).

Next, a doped structure for forming the first nitride semiconductor 121 is described. Hereinafter, only structures or methods different from the foregoing structures are introduced, and the contents having the same structures and methods are not described again in detail.

Figure 33:
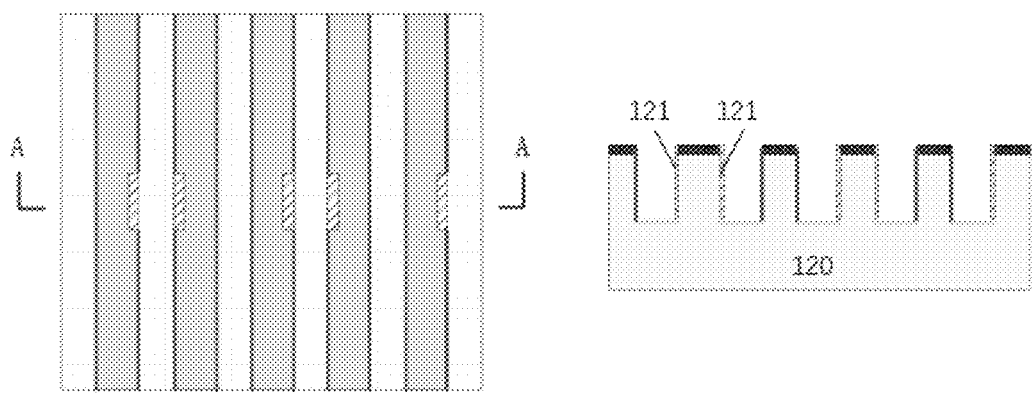

As shown in FIG. 33, the description is made on the basis of the structure of FIG. 18 formed by the foregoing method, and the drawing is renumbered as FIG. 33.

Figure 34:
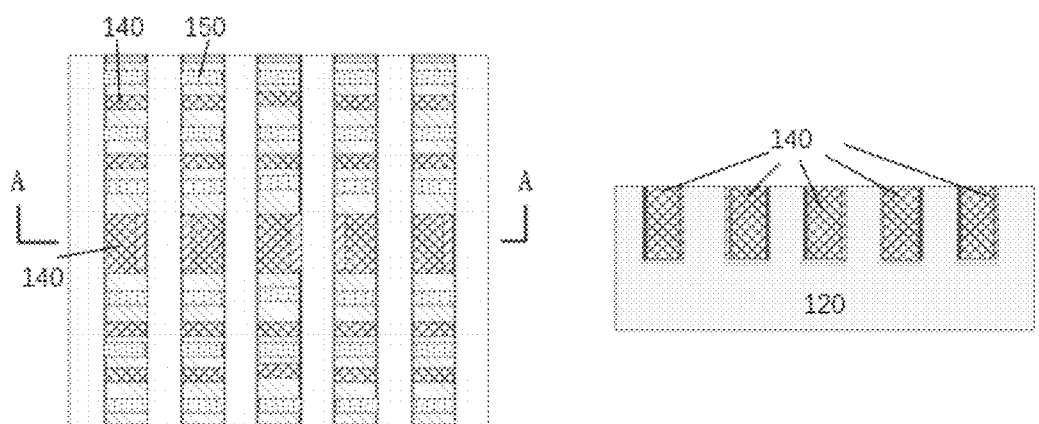

Optionally, as shown in FIG. 34, the first nitride semiconductor layer 122 is epitaxially grown laterally with the nucleation layer 121 as a core, and due to the presence of the first grooves 803, the first nitride semiconductor layer 122 starts to be epitaxially grown laterally along the first grooves 803 from the nucleation layer. The first nitride semiconductor layer 122 may also be grown outside the grooves, and the first nitride semiconductor layer 122 outside the first grooves 803 is removed by a planarization or etching technique. Optionally, the material of the first nitride semiconductor layer 122 is the same as that of the foregoing structure.

Different from the foregoing structure, in the lateral epitaxy, a plurality of doped regions 140 of the first conductivity type (e.g., N-type) and a plurality of doped regions 150 of the second conductivity type (e.g., P-type) are alternately formed in the first nitride semiconductor layer 122.

Figure 35:
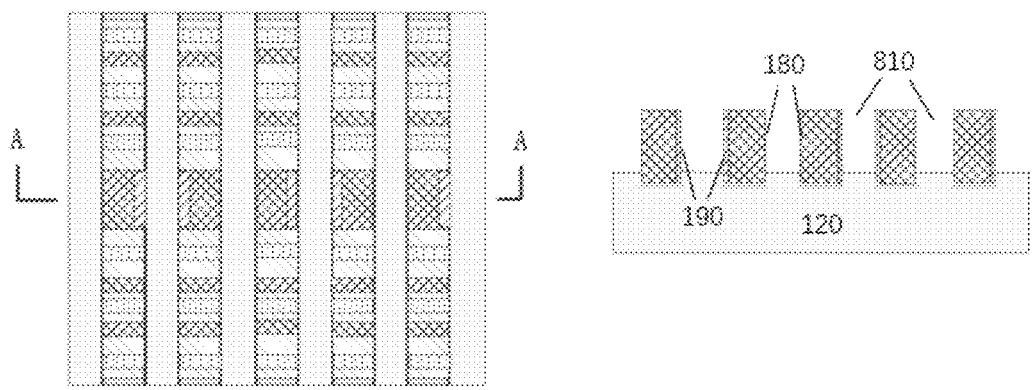

As shown in FIG. 35, the silicon substrate 120 between the first nitride semiconductor layers 122 is etched, to remove the first insulating layer 802 and a part of the silicon substrate 120, and form the second grooves 810, thereby exposing the side surfaces 180, 190 in the <0001> and <000$\bar{1}$> directions of the first nitride semiconductor layers 122, of which corresponding crystal faces are (0001) face and (000$\bar{1}$) face, respectively. In other words, the side surface 180 of the first nitride semiconductor layer 122 in the <0001> direction is the first region 124 of the first nitride semiconductor layer 122, and the side surface 190 of the first nitride semiconductor layer 122 in the <000$\bar{1}$> direction is the second region 125 of the first nitride semiconductor layer 122.

Figure 36:
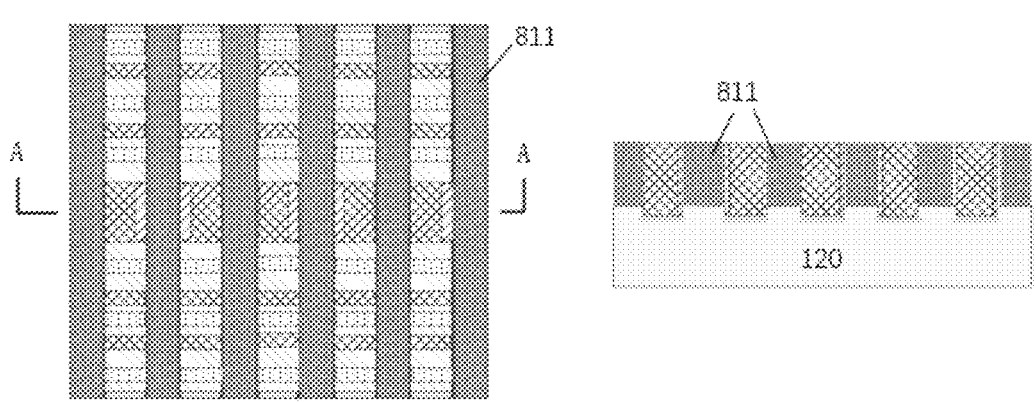

As shown in FIG. 36, a fourth insulating layer 811 is formed on the etched substrate 120 to fill the second grooves 810 and the planarization is performed, so as to isolate the exposed silicon substrate. The fourth insulating layer 811 may be exemplarily a silicon dioxide layer.

Figure 37:
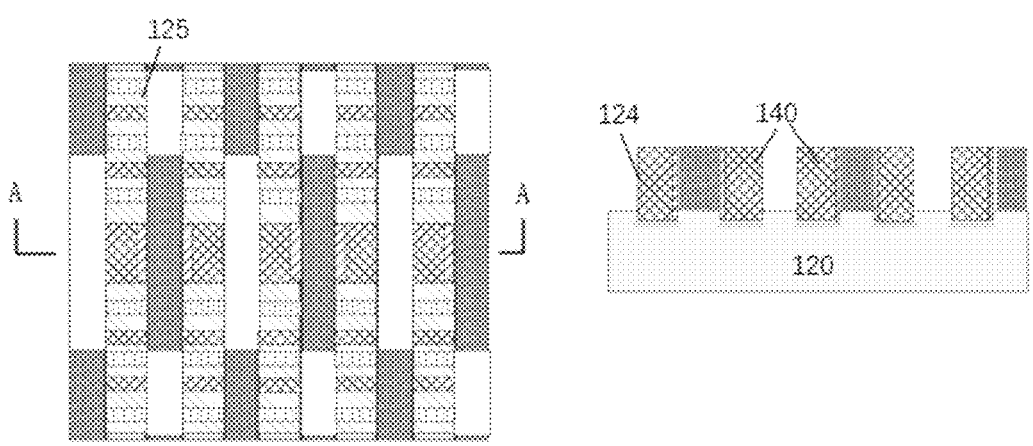

As shown in FIG. 37, a part of the fourth insulating layer 811 on the bottom portions and side walls in the second grooves 810 is etched to expose the first region 124 and the second region 125 of a part of the first nitride semiconductor layer 122.

Figure 38:
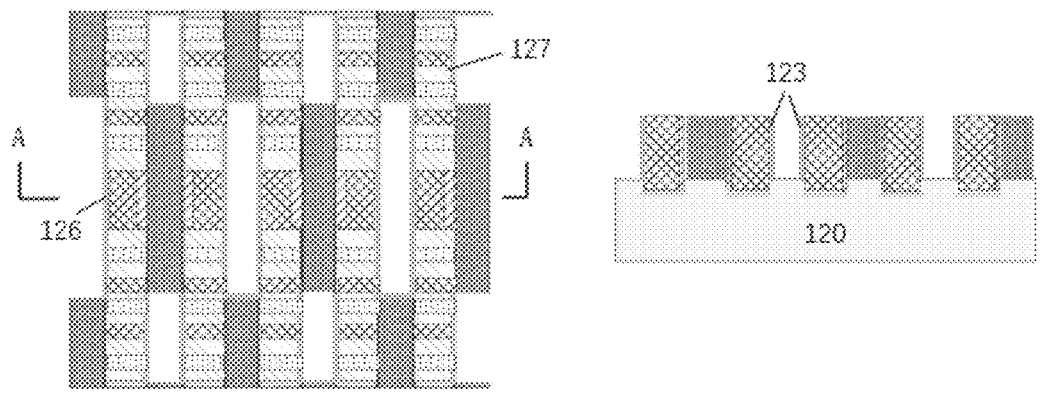

As shown in FIG. 38, the second nitride semiconductor layer 123 is then formed on the exposed first region 124 and second region 125 of the first nitride semiconductor layer 122, which forms a laminated structure respectively with the first region 124 and the second region 125 of the first nitride semiconductor layer 122. Optionally, the material of the second nitride semiconductor layer 123 is the same as that of the foregoing structure. Optionally, the laminated structure, for example, may be a laminated structure of a first sub-layer/a second sub-layer of the first nitride semiconductor layer 122 and a first sub-layer/a second sub-layer of the second nitride semiconductor layer 123. The first nitride semiconductor structure and the second nitride semiconductor structure are formed simultaneously.

Figure 39:
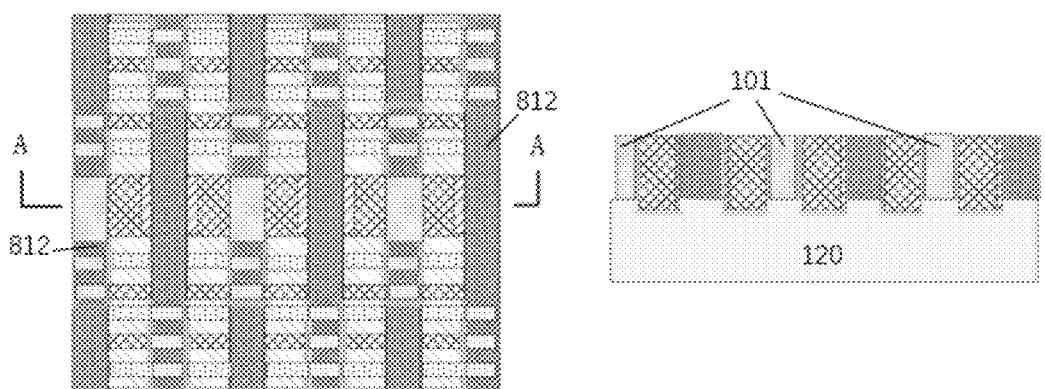

As shown in FIG. 39 and FIGS. 2 and 3, the fifth insulating layer 812 is formed on the foregoing structure to fill the second grooves 810, and the fifth insulating layer 812 is subjected to photolithography to form a source electrode window, a drain electrode window, and a gate electrode window. Ti, Al, Ti and TiN four layers of metal is evaporated in the source electrode window and the drain electrode window, by adopting a technique known to a person skilled in the art, for example, the electron beam evaporation technology, for example, the thickness may be 20 nm, 130 nm, 25 nm, and 70 nm, and after peeling and annealing, an ohmic electrode in ohmic contact with the two-dimensional carrier gas is formed, and a gate electrode insulated from or in Schottky contact with the second nitride semiconductor layer 123 is formed in the gate electrode window, that is, the source electrode 101/201, the drain electrode 103/203, and the gate electrode 102/202 of the HEMT 100 and the HHMT 200 are formed. These electrode structures may also be formed by etching.

Specifically, the first source electrode 101 and the first drain electrode 103 are distributed opposite to each other on either side of the first gate electrode 102, and are coupled with the two-dimensional carrier gas of the first conductivity type, to form at least one first transistor 100. In the above, in the first transistor 100, the doped region 150 of the second conductivity type (for example, P-type) at least partially overlaps the first gate electrode 102 in a <0001> crystal orientation projection direction, and substantially depletes the two-dimensional carrier gas of the first conductivity type in the vicinity of the first gate electrode 102, and the doped region 140 of the first conductivity type (for example, N-type) is electrically coupled with the first source electrode 101 and the first drain electrode 103, respectively. In addition, the second source electrode 201 and the second drain electrode 203 are distributed opposite to each other on either side of the second gate electrode 202, and are coupled with the two-dimensional carrier gas of the second conductivity type, to form at least one second transistor 200. In the above, in the second transistor 200, the doped region 140 of the first conductivity type (for example, N-type) at least partially overlaps the second gate electrode 202 in a <0001> crystal orientation projection direction, and substantially depletes the two-dimensional carrier gas of the second conductivity type in the vicinity of the second gate electrode 202, and the doped region 150 of the second conductivity type (for example, P-type) is electrically coupled with the second source electrode 201 and the second drain electrode 203, respectively.

Figure 40:
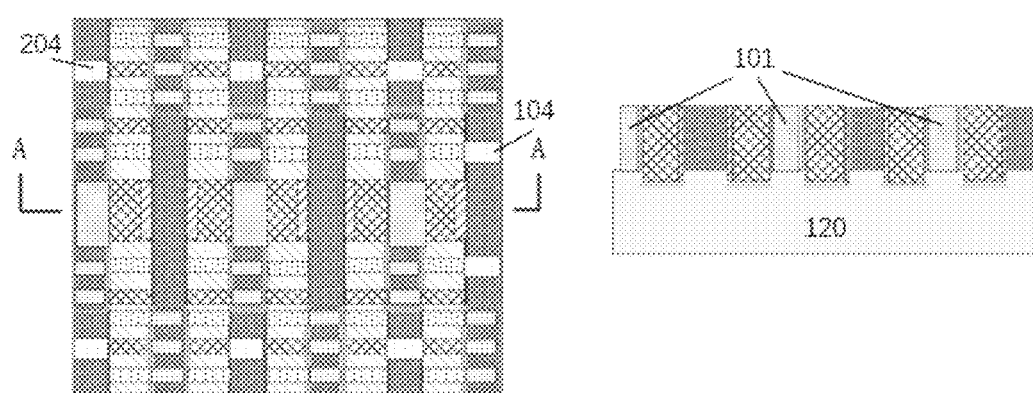

As shown in FIG. 40 and FIG. 3, in order to control the threshold voltage of the transistor, body electrodes 104, 204 further may be formed on the foregoing structure, which are respectively electrically connected to the doped region 150 of the second conductivity type (for example, P-type) and the doped region 140 of the first conductivity type (for example, N-type). Specifically, optionally, the first transistor 100 further includes a first body electrode 104, which is provided opposite to the first gate electrode 102 on a side surface of the first nitride semiconductor structure. The second transistor 200 further includes a second body electrode 204, which is provided opposite to the second gate electrode 202 on a side surface of the second nitride semiconductor structure.

Optionally, in order to remove the two-dimensional carrier gas between different transistors, i.e., 2DEG and 2DHG, to prevent electrical connection between different transistors due to 2DEG and 2DHG, groove isolation structures may be formed between different transistors.

The solutions of the present disclosure at least can help to realize one of the following effects: the integrated circuit structure in the present disclosure is a complementary circuit of HEMT and HHMT based on the group III nitride semiconductor, and can realize the integration of HEMT and HHMT on the same substrate, and the HEMT and the HHMT respectively have a polarized junction with a vertical interface, the crystal orientations of the polarized junctions of the HEMT and the HHMT are different, the two-dimensional carrier gas forms a carrier channel in a direction parallel to the polarized junction, and corresponding channel carriers are almost depleted by burying the doped region. By utilizing the polarization characteristics of the group III nitride semiconductor, the present disclosure creatively realizes that the complementary two-dimensional carrier gases are generated on the polarized junction interfaces in different crystal orientations, and enables the HEMT and the HHMT of the group III nitride semiconductor to be integrated on one substrate, thus forming the complementary integrated circuit structure. Compared with the conventional silicon-based complementary circuit such as CMOS, the 2DEG and the 2DHG of the integrated circuit structure of the present disclosure have advantages in aspects of carrier mobility, on-state current density, switching speed and so on, the on-resistance and the parasitic inductance become low, and the device is in a normally-off state, so that the technical effects of higher on-state current density, higher integration degree, and lower energy consumption can be achieved.

The solutions in the present disclosure can at least help to realize one of the following effects: the integrated circuit structure of the present disclosure, as a core part of electronic devices, can be widely used in analog or digital integrated circuits such as phase inverters, amplifiers, NAND gates, and NOR gates.

The solutions in the present disclosure can also contribute to achieve one of the following effects: the manufacturing method of the integrated circuit structure in the present disclosure can realize higher channel density in unit area; the method is suitable for a planarization process, and is beneficial to improving the integration density of the transistor; and the integrated circuit structure is simple in process and can effectively reduce the production cost.

The above description refers to elements or nodes or features being "connected" or "coupled" together. As used in the present disclosure, unless expressly stated otherwise, "connect" means that one element is directly coupled with (or directly communicates with) another element, but not necessarily mechanically connected. Likewise, unless expressly stated otherwise, "couple" means that one element is directly or indirectly coupled to (directly or directly communicates with) another element, but not necessarily mechanically coupled. Thus, although the schematic diagrams shown in the drawings depict one exemplary element arrangement, additional intermediate elements, devices, features, or components may be proposed in an embodiment of the depicted subject matter.

Although at least one exemplary embodiment has been proposed in the above detailed description, it also should be recognized that there are a large number of changes. Moreover, it should be understood by a person skilled in the art that these descriptions are illustrative, and not intended to limit the scope of protection of the present disclosure. A person skilled in the art could make various modifications and changes to the present disclosure in accordance with the spirit and principle of the present disclosure, and these modifications and changes are also within the scope of the present disclosure.

INDUSTRIAL APPLICABILITY

The integrated circuit structure of a group III nitride semiconductor and the manufacturing method provided in the present disclosure are simple in process and low in cost, and realize higher degree of integration in unit area, wherein the integrated circuit structure is a complementary semiconductor integrated circuit structure having high performances such as high withstand voltage, high power, and lower on-resistance.

What is claimed is:

1. An integrated circuit structure, comprising:
   at least one first transistor, comprising:
   a first nitride semiconductor structure having a first polarized junction, which has a two-dimensional carrier gas of a first conductivity type;
   a first gate electrode, which is provided on the first nitride semiconductor structure; and
   a first source electrode and a first drain electrode, which are distributed opposite to each other on two sides of the first gate electrode, and are coupled with the two-dimensional carrier gas of the first conductivity type; and
   at least one second transistor, comprising:
   a second nitride semiconductor structure having a second polarized junction, which has a two-dimensional carrier gas of a second conductivity type;
   a second gate electrode, which is provided on the second nitride semiconductor structure; and
   a second source electrode and a second drain electrode, which are distributed opposite to each other on two sides of the second gate electrode, and are electrically coupled with the two-dimensional carrier gas of the second conductivity type, wherein
   the first polarized junction and the second polarized junction have different crystal orientations,
   the two-dimensional carrier gas of the first conductivity type and the two-dimensional carrier gas of the second conductivity type are of different conductivity types, and
   the two-dimensional carrier gas of the first conductivity type and the two-dimensional carrier gas of the second conductivity type form a carrier channel in a direction parallel to the first polarized junction and in a direction parallel to the second polarized junction, respectively,
   the first nitride semiconductor structure and the second nitride semiconductor structure are epitaxially grown on a same substrate, and
   the first polarized junction and the second polarized junction each have a vertical interface.

2. The integrated circuit structure according to claim 1, wherein the at least one first transistor and the at least one second transistor are complementary and connected in series, wherein the first gate electrode and the second gate electrode are connected together to serve as an input terminal, the first source electrode or the second source electrode is coupled with ground or an external negative power supply $V_{SS}$, the second source electrode or the first source electrode is coupled with an external positive power supply $V_{DD}$, and the first drain electrode and the second drain electrode are connected together to serve as an output terminal.

3. The integrated circuit structure according to claim 1, wherein at least two first transistors are connected in series or in parallel to serve as a first unit, and at least two second transistors are connected in parallel or in series to serve as a second unit, wherein the series connection or the parallel connection in the first unit is corresponding to the parallel connection or the series connection in the second unit, and the first unit and the second unit are connected in series together and a connection terminal where the first unit and the second unit are connected in series serves as an output terminal, the at least two first transistors in the first unit are in complementary pairing with the at least two second transistors in the second unit, and the first gate electrode and the second gate electrode of transistors in complementary pairing are connected together to serve as input terminals, respectively.

4. The integrated circuit structure according to claim 3, wherein the at least two first transistors in the first unit are able to be connected in series or in parallel in any number, and a corresponding number of the at least two second transistors in the second unit in complementary pairing with the at least two first transistors in the first unit are able to be connected in parallel or in series.

5. The integrated circuit structure according to claim 1, further comprising a nucleation layer.

6. The integrated circuit structure according to claim 1, wherein the first nitride semiconductor structure further comprises a first doped structure, wherein the first doped structure is electrically coupled with the two-dimensional carrier gas of the first conductivity type.

7. The integrated circuit structure according to claim 6, wherein the second nitride semiconductor structure further comprises a second doped structure, wherein the second doped structure is electrically coupled with the two-dimensional carrier gas of the second conductivity type.

8. The integrated circuit structure according to claim 7, wherein the first doped structure comprises at least one doped region of the second conductivity type, which at least partially overlaps the first gate electrode in a projection direction of crystal orientation.

9. The integrated circuit structure according to claim 8, wherein the second doped structure comprises at least one doped region of the first conductivity type, which at least partially overlaps the second gate electrode in a projection direction of crystal orientation.

10. An electronic device, comprising the integrated circuit structure according to claim 1.

* * * * *